US012756382B2

(12) United States Patent
Yoon et al.

(10) Patent No.: US 12,756,382 B2
(45) Date of Patent: Oct. 6, 2026

(54) TRANSMITTER INTERPOLATING CLOCK SIGNAL, COMMUNICATION DEVICE INCLUDING THE SAME, AND METHOD OF OPERATING THE SAME

(71) Applicant: Samsung Electronics Co., Ltd., Suwon-si (KR)

(72) Inventors: Donghyun Yoon, Suwon-si (KR); Jueon Kim, Suwon-si (KR); Myoungbo Kwak, Suwon-si (KR); Jaewoo Park, Suwon-si (KR); Young Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 23 days.

(21) Appl. No.: 19/067,213

(22) Filed: Feb. 28, 2025

(65) Prior Publication Data

US 2026/0066887 A1 Mar. 5, 2026

(30) Foreign Application Priority Data

Sep. 5, 2024 (KR) ........................ 10-2024-0120838

(51) Int. Cl.
*H03K 5/135* (2006.01)
*H03K 17/693* (2006.01)
(Continued)

(52) U.S. Cl.
CPC ........... *H03K 5/135* (2013.01); *H03K 17/693* (2013.01); *H04L 7/0025* (2013.01); *H03K 2005/00052* (2013.01); *H03K 19/20* (2013.01)

(58) Field of Classification Search
CPC ...... H03K 5/135; H03K 17/693; H03K 19/20; H03K 2005/00052; H04L 7/0025
See application file for complete search history.

(56) References Cited

U.S. PATENT DOCUMENTS 7,271,634 B1 9/2007 Daga et al.
9,461,655 B2 10/2016 Boecker et al.
(Continued)

FOREIGN PATENT DOCUMENTS

KR 10-2334889 B1 12/2021

OTHER PUBLICATIONS

J. Kim et al., "A 224-GB/s DAC-Based PAM-4 Quarter-Rate Transmitter With 8-Tap FFE in 10-nm FinFET", IEEE Journal of Solid-State Circuits, vol. 57, No. 1. Institute of Electrical and Electronics Engineers (IEEE), pp. 6-20, Jan. 2022.
(Continued)

*Primary Examiner* — Jean B Corrielus
(74) *Attorney, Agent, or Firm* — Fish & Richardson P.C.

(57) ABSTRACT

Disclosed is a transmitter including a phase interpolator configured to generate an internal four-phase clock signal based on a four-phase clock signal including a first clock signal, a second clock signal, a third clock signal, and a fourth clock signal, a data path configured to generate a path data signal based on a data signal and the internal four-phase clock signal, a driver configured to generate a transmission data signal based on the path data signal and the four-phase clock signal. The driver is further configured to provide the phase interpolator with a control signal indicating a first phase state, a second phase state, or a third phase state based on a first path bit signal of the path data signal, the first clock signal, and the fourth clock signal. The phase interpolator is further configured to interpolate the internal four-phase clock signal based on the control signal.

20 Claims, 15 Drawing Sheets

130

(51) Int. Cl.

| | |
|---|---|
| ***H04L 7/00*** | (2006.01) |
| *H03K 5/00* | (2006.01) |
| *H03K 19/20* | (2006.01) |

(56) References Cited

U.S. PATENT DOCUMENTS

| | | | | | |
|---|---|---|---|---|---|
| 10,103,870 | B2 | 10/2018 | Shibasaki | | |
| 10,305,709 | B2 | 5/2019 | Hori et al. | | |
| 10,560,097 | B1 | 2/2020 | Peng et al. | | |
| 10,819,499 | B2 | 10/2020 | Hormati | | |
| 10,936,007 | B2 | 3/2021 | Yang et al. | | |
| 2004/0052323 | A1* | 3/2004 | Zhang | H03K 5/13 | 375/375 |
| 2012/0177159 | A1* | 7/2012 | Kong | H03L 7/087 | 375/359 |
| 2014/0132317 | A1* | 5/2014 | Yanagawa | H03K 5/159 | 327/269 |
| 2017/0149555 | A1* | 5/2017 | Cohen | H04L 7/0332 | |
| 2023/0122556 | A1* | 4/2023 | Lin | H03H 17/026 | 375/371 |
| 2023/0307022 | A1 | 9/2023 | Yoon et al. | | |
| 2024/0097873 | A1* | 3/2024 | Meruva | H03K 5/135 | |
| 2025/0158653 | A1* | 5/2025 | Kang | H04B 1/7085 | |

OTHER PUBLICATIONS

Z. Toprak-Deniz et al., “A 128-GB/s 1.3-pJ/b PAM-4 Transmitter With Reconfigurable 3-Tap FFE in 14-nm CMOS”, IEEE Journal of Solid-State Circuits, vol. 55, No. 1. Institute of Electrical and Electronics Engineers (IEEE), pp. 19-26, Jan. 2020.

J. Im et al., “A 112-GB/s PAM-4 Long-Reach Wireline Transceiver Using a 36-Way Time-Interleaved SAR ADC and Inverter-Based RX Analog Front-End in 7-nm FinFET”, IEEE Journal of Solid-State Circuits, vol. 56, No. 1. Institute of Electrical and Electronics Engineers (IEEE), pp. 7-18, Jan. 2021.

* cited by examiner

FIG. 12

| | Detector (132b1) | | Up Counter (132b2u) | Down Counter (132b2d) | Description |
|---|---|---|---|---|---|
| | Q0 | Q90 | CTRb1 | CTRb2 | |
| Late | 0 | 0 | 0 | 1 | This case means that the data signal is slower than the clock signal. |
| Hold | 0 | 1 | 0 | 0 | This case means that the timing of the data signals is appropriate. |
| | 1 | 0 | 0 | 0 | This case means that an error longer than the period of the clock signal occurred. |
| Early | 1 | 1 | 1 | 0 | This case means that the data signal is faster than the clock signal. |

TRANSMITTER INTERPOLATING CLOCK SIGNAL, COMMUNICATION DEVICE INCLUDING THE SAME, AND METHOD OF OPERATING THE SAME

CROSS-REFERENCE TO RELATED APPLICATIONS

This application claims priority under 35 U.S.C. § 119 to Korean Patent Application No. 10-2024-0120838 filed on Sep. 5, 2024, in the Korean Intellectual Property Office, the disclosures of which are incorporated by reference herein in their entireties.

BACKGROUND

Example embodiments of the present disclosure described herein relate to communication devices, and more particularly, relate to transmitters for interpolating a clock signal, communication devices including the same, and methods of operating the same.

An electronic system manages data indicating various pieces of information. The electronic system may include various components such as a processor, a memory, and the like. The components may function as communication devices that communicate data through a communication interface circuit. A communication device may generate a transmission data signal based on a clock signal and a data signal, and may provide the transmission data signal to another communication device through the communication interface circuit.

Nowadays, as the capacity of data managed by electronic systems increases, the number of data lines, through which data signals are transmitted within components of the electronic system, is increasing, and the frequency of a clock signal is increasing. When several data signals are processed by using a high-frequency clock signal, a skew between the clock signal and the data signal may occur. To minimize or reduce the skew, a technique for adjusting the timing of the clock signal may be beneficial.

SUMMARY

Example embodiments of the present disclosure provide transmitters for interpolating a clock signal, communication devices including the same, and methods of operating the same.

According to some example embodiments, a transmitter includes a phase interpolator configured to generate an internal four-phase clock signal based on a four-phase clock signal including a first clock signal, a second clock signal, a third clock signal, and a fourth clock signal, a data path configured to generate a path data signal based on a data signal and the internal four-phase clock signal, a driver configured to generate a transmission data signal based on the path data signal and the four-phase clock signal. The driver is further configured to provide the phase interpolator with a control signal indicating a first phase state, a second phase state, or a third phase state based on a first path bit signal of the path data signal, the first clock signal, and the fourth clock signal. The phase interpolator is further configured to interpolate the internal four-phase clock signal based on the control signal.

According to some example embodiments, a communication device includes a data management circuit configured to manage a data signal, a clock generator configured to generate a four-phase clock signal including a first clock signal, a second clock signal, a third clock signal, and a fourth clock signal, a transmitter configured to provide a first transmission data signal to an external receiver, and a receiver configured to receive a second transmission data signal from an external transmitter. The transmitter includes a phase interpolator configured to generate an internal four-phase clock signal based on the four-phase clock signal, a data path configured to generate a path data signal based on the data signal and the internal four-phase clock signal, at least one multiplexer configured to generate the first transmission data signal based on the path data signal and the four-phase clock signal, and a tri-state phase detector configured to provide the phase interpolator with a control signal indicating a first phase state, a second phase state, or a third phase state based on a target path bit signal of the path data signal, the first clock signal, and the fourth clock signal. The phase interpolator is further configured to interpolate the internal four-phase clock signal based on the control signal.

According to some example embodiments, a method of operating a transmitter includes generating an internal four-phase clock signal based on a four-phase clock signal including a first clock signal, a second clock signal, a third clock signal, and a fourth clock signal, generating a path data signal based on a data signal and the internal four-phase clock signal, generating a control signal indicating a late state, a hold state, or an early state based on a target path bit signal of the path data signal, the first clock signal, and the fourth clock signal, and interpolating the internal four-phase clock signal based on the control signal.

BRIEF DESCRIPTION OF THE FIGURES

The above and other objects and features of the present disclosure will become apparent by describing in detail some example embodiments thereof with reference to the accompanying drawings.

FIG. 12 is a table for describing the detection signal and the control signal of FIG. 10, according to some example embodiments of the present disclosure.

DETAILED DESCRIPTION

Hereinafter, embodiments of the present disclosure will be described in detail and clearly to such an extent that one skilled in the art easily carries out the present disclosure.

Figure 1:
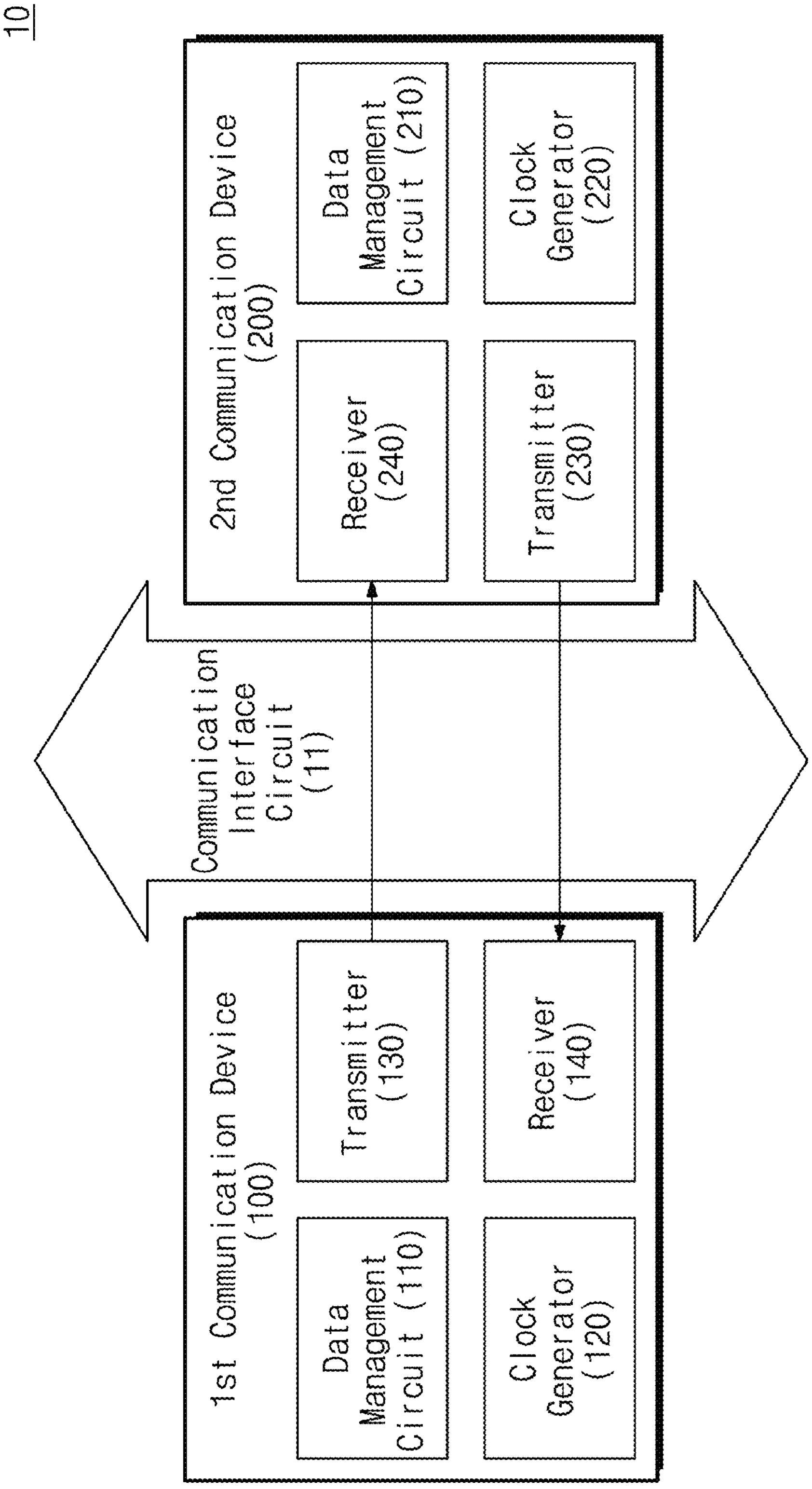
FIG. 1 is a block diagram of an electronic system, according to some example embodiments of the present disclosure.

FIG. 1 is a block diagram of an electronic system, according to some example embodiments of the present disclosure. Referring to FIG. 1, an electronic system 10 may manage data indicating various pieces of information. The electronic system 10 may be implemented as a computing system that processes various pieces of information and/or stores the processed information as data. For example, the electronic system 10 may be implemented as a computing system, which is configured to process various pieces of information, such as a personal computer (PC), a notebook, a laptop, a server, a workstation, a tablet PC, a smartphone, a digital camera, a black box, or the like. Alternatively, the electronic system 10 may be implemented as a storage system, a server system, a database server, or the like for managing large amounts of user data.

The electronic system 10 may include a plurality of components for managing data. For example, the plurality of components may be implemented as a processor, a volatile memory device, a non-volatile memory device, a network interface card (NIC), a graphics card, or the like. The components may function as communication devices (e.g., a first communication device 100 and a second communication device 200) that communicate data to each other.

The electronic system 10 may include a communication interface circuit 11, the first communication device 100, and the second communication device 200. The first communication device 100 and the second communication device 200 may also be referred to as a "first component" and a "second component" of the electronic system 10, respectively. The first communication device 100 and the second communication device 200 may exchange data with each other through the communication interface circuit 11.

The communication interface circuit 11 may provide an interface between the first communication device 100 and the second communication device 200. For example, the communication interface circuit 11 may be implemented as a peripheral component interconnect express (PCIe) communication interface circuit.

The first communication device 100 may include a data management circuit 110, a clock generator 120, a transmitter 130, and a receiver 140.

The data management circuit 110 may manage data signals. The data signal may be an electrical signal indicating information managed by the first communication device 100. The data management circuit 110 may provide a data signal to the transmitter 130, or may receive a data signal from the outside (e.g., the second communication device 200) through the receiver 140. For example, the data management circuit 110 may be implemented with a processor, a memory controller, or the like.

The clock generator 120 may generate a clock signal. The clock signal may be a signal that periodically toggles between a logic high level (e.g., a logic value '1') and a logic low level (e.g., a logic value '0'). The clock generator 120 may provide a clock signal to the transmitter 130. The transmitter 130 may process a data signal by using a clock signal. For example, the transmitter 130 may perform a serialization operation, an emphasis operation, a multiplexing operation, or the like based on the data signal and the clock signal.

The transmitter 130 may receive the data signal from the data management circuit 110. The transmitter 130 may receive a clock signal from the clock generator 120. The transmitter 130 may generate a transmission data signal based on the data signal and the clock signal. The transmitter 130 may provide the transmission data signal to the second communication device 200 through the communication interface circuit 11. With respect to the transmitter 130, the second communication device 200 and a receiver 240 may also be referred to as an "external communication device" and an "external receiver", respectively.

The receiver 140 may receive a transmission data signal from a transmitter 230 of the second communication device 200 through the communication interface circuit 11. The receiver 140 may provide the transmission data signal to the data management circuit 110. The data management circuit 110 may process the transmission data signal. With respect to the receiver 140, the second communication device 200 and the transmitter 230 may also be referred to as an "external communication device" and an "external transmitter", respectively.

The second communication device 200 may include a data management circuit 210, a clock generator 220, the transmitter 230, and the receiver 240. The features of the data management circuit 210, the clock generator 220, the transmitter 230, and the receiver 240 may be similar to the features of the data management circuit 110, the clock generator 120, the transmitter 130, and the receiver 140 of the first communication device 100.

According to some example embodiments of the present disclosure, as the capacity of data managed by the electronic system 10 increases, the number of data lines (e.g., data lines between a data management circuit and a transmitter), through which data signals are transmitted within a component (e.g., a communication device) of the electronic system 10, may increase, and the frequency of a clock signal may increase. When several data signals are processed by using a high-frequency clock signal, a skew between the clock signal and the data signal may occur.

The skew may refer to a mismatch between the timing of a clock signal and the timing of a data signal. An excessive skew (e.g., an unacceptable or larger skew) may reduce margins for data communication, such as a setup margin and a hold margin. The setup margin may refer to a section from a point in time when data to be transmitted becomes valid to a point in time when selection by the clock signal begins. The hold margin may refer to a section from a point at which the selection by the clock signal is completed to a point in time when data to be transmitted becomes invalid. The setup margin and the hold margin will be described in more detail later with reference to FIG. 8.

When the margin for communication is reduced by the skew (e.g., an excessive or unacceptable skew), a high-frequency clock signal may become unavailable, or error bits in the transmitted data signal may occur. Accordingly, some example embodiments disclose a technique for minimizing or reducing the skew between the clock signal and the data signal.

Figure 2:
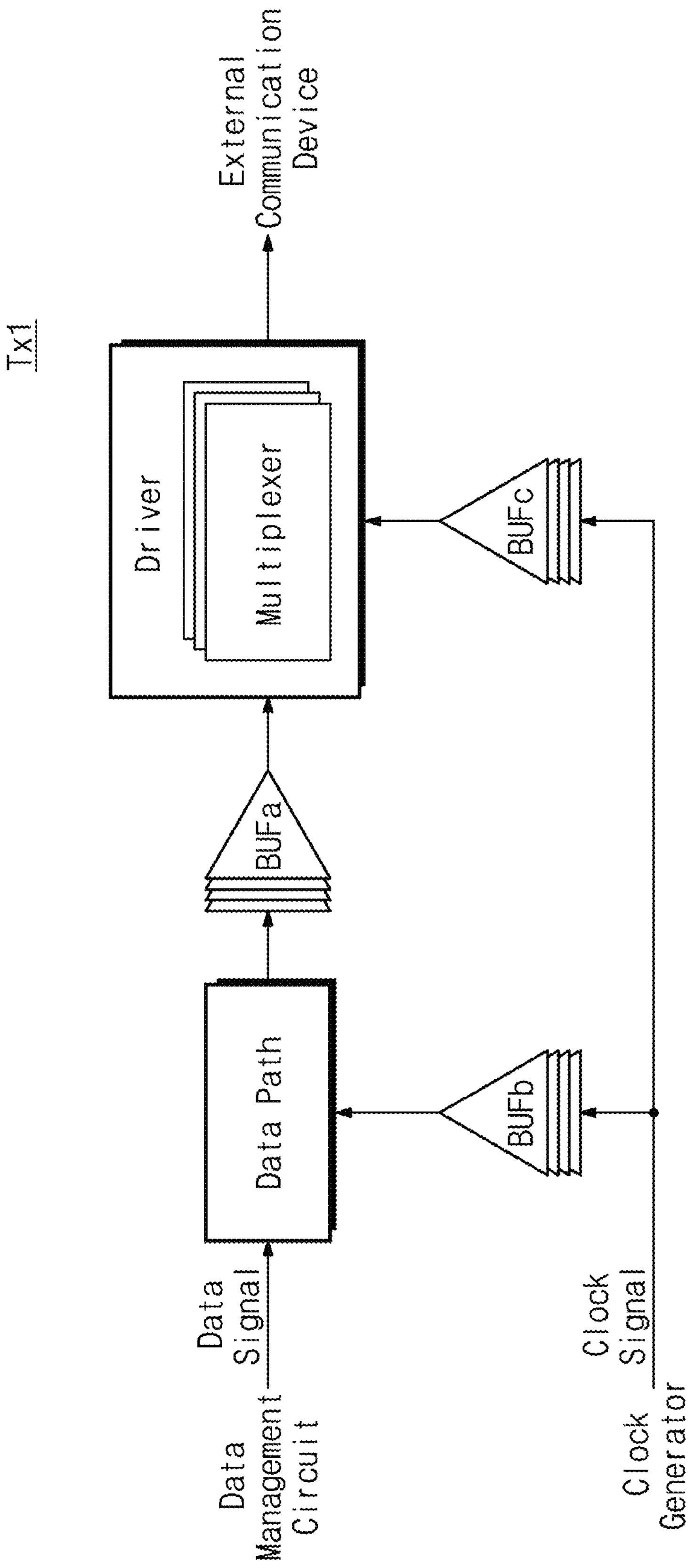
FIG. 2 is a block diagram of a general transmitter.

FIG. 2 is a block diagram of a general transmitter. Referring to FIG. 2, a general transmitter Tx1 may communicate with an external communication device. The general transmitter Tx1 may correspond to the transmitter 130 or the transmitter 230 of FIG. 1. The general transmitter Tx1 is described for better understanding of the present disclosure. However, the general transmitter Tx1 may include additional features as disclosed herein. The general transmitter Tx1 is not intended to limit the scope of the present disclosure.

The general transmitter Tx1 may include a data path, a driver, buffers BUFa, buffers BUFb, and buffers BUFc. The driver may include multiplexers.

The data path may receive a data signal from a data management circuit. The data path may receive a delayed clock signal from a clock generator through the buffers BUFb. The delay level of the delayed clock signal in the data path may depend on the number of buffers BUFb. The data path may generate a path data signal based on the data signal and the delayed clock signal. The data path may provide a delayed path data signal to the driver through the buffers BUFa. The delay level of the delayed path data signal in the driver may depend on the number of buffers BUFa.

The driver may receive the delayed path data signal from the data path through the buffers BUFa, and may receive a delayed clock signal from a clock generator through the buffers BUFc. The delay level of the delayed clock signal in the driver may depend on the number of buffers BUFc. The multiplexers of the driver may generate a transmission data signal based on the delayed path data signal and the delayed clock signal, and may provide the transmission data signal to an external communication device.

In the general transmitter Tx1, the buffers BUFa, the buffers BUFb, and the buffers BUFc may be inserted to minimize or reduce a skew between the clock signal and the data signal provided to the driver. The buffers BUFa, the buffers BUFb, and the buffers BUFc of the transmitter Tx1 may reduce a skew, but may increase power consumption and noise, and may be vulnerable to process voltage temperature (PVT) fluctuations.

Figure 3:
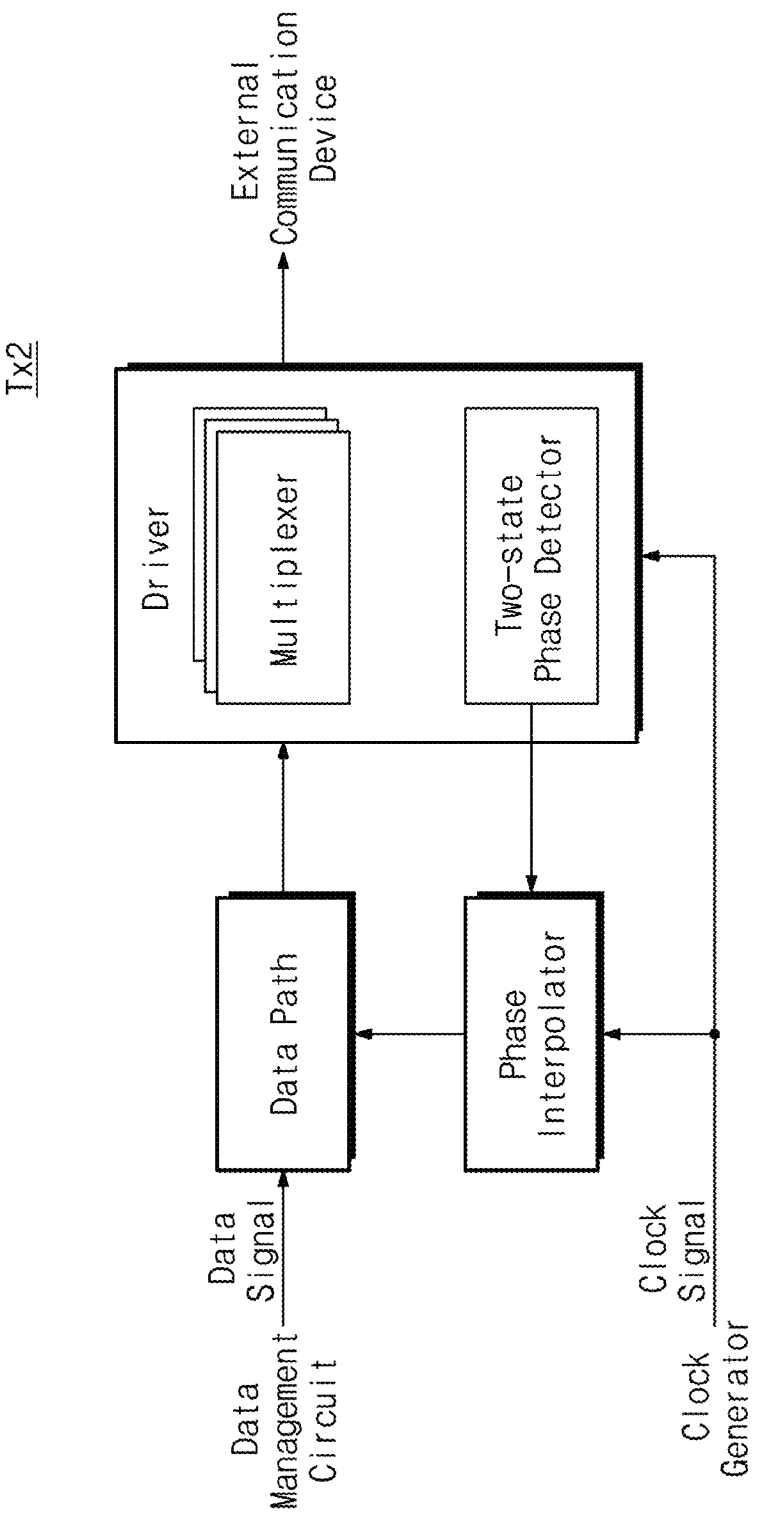
FIG. 3 is a block diagram of a general transmitter.

FIG. 3 is a block diagram of a general transmitter. Referring to FIG. 3, a general transmitter Tx2 may communicate with an external communication device. The general transmitter Tx2 may correspond to the transmitter 130 or the transmitter 230 of FIG. 1. The general transmitter Tx2 is described for better understanding of the present disclosure. However, the general transmitter Tx2 may include additional features as disclosed herein. The general transmitter Tx2 is not intended to limit the scope of the present disclosure.

The general transmitter Tx2 may include a data path, a driver, and a phase interpolator. The driver may include multiplexers and a two-state phase detector.

The data path may receive a data signal from a data management circuit. The data path may receive an internal clock signal from the phase interpolator. The internal clock signal may be generated based on a clock signal by a phase interpolator. The data path may generate a path data signal based on the data signal and the internal clock signal. The data path may provide the path data signal to the driver.

The driver may receive the path data signal from the data path. The driver may receive the clock signal from a clock generator. The multiplexers of the driver may generate a transmission data signal based on the path data signal and the clock signal, and may provide the transmission data signal to an external communication device. The two-state phase detector of the driver may compare the phase (e.g., the amount of time delay) of the path data signal with the phase of the clock signal, and may provide a control signal indicating a late state or an early state to the phase interpolator. The late state may indicate that the phase of the path data signal is later than the phase of the clock signal. The early state may indicate that the phase of the path data signal is earlier than the phase of the clock signal.

The phase interpolator may receive the clock signal from the clock generator. The phase interpolator may receive the control signal indicating the late state or the early state from the two-state phase detector. The phase interpolator may generate the internal clock signal by interpolating (e.g., adjusting a phase) the clock signal based on the control signal, and may provide the internal clock signal to the data path. The phase interpolator may interpolate the internal clock signal by a feedback loop including the phase interpolator, the data path, and the two-state phase detector. Accordingly, the skew between the path data signal and the clock signal, which are provided to the driver, may be reduced.

Unlike the general transmitter Tx1 of FIG. 2, the general transmitter Tx2 may reduce a skew without buffers, and thus power consumption and noise due to the buffers may be reduced, and it may be robust (e.g., have improved resilience) to PVT fluctuations.

However, because the two-state phase detector classifies a phase state of the path data signal as only a late state or an early state, a phase may be unnecessarily adjusted even when there is little or no skew, or the phase may be adjusted to increase the skew. In other words, the phase of the internal clock signal may unnecessarily change within the range of the resolution for phase discrimination of the two-state phase detector. This operation may waste a setup margin and a hold margin. Some example embodiments, with respect to a path data signal having a low skew, may disclose a technique for suppressing unnecessary phase interpolation.

Figure 4:
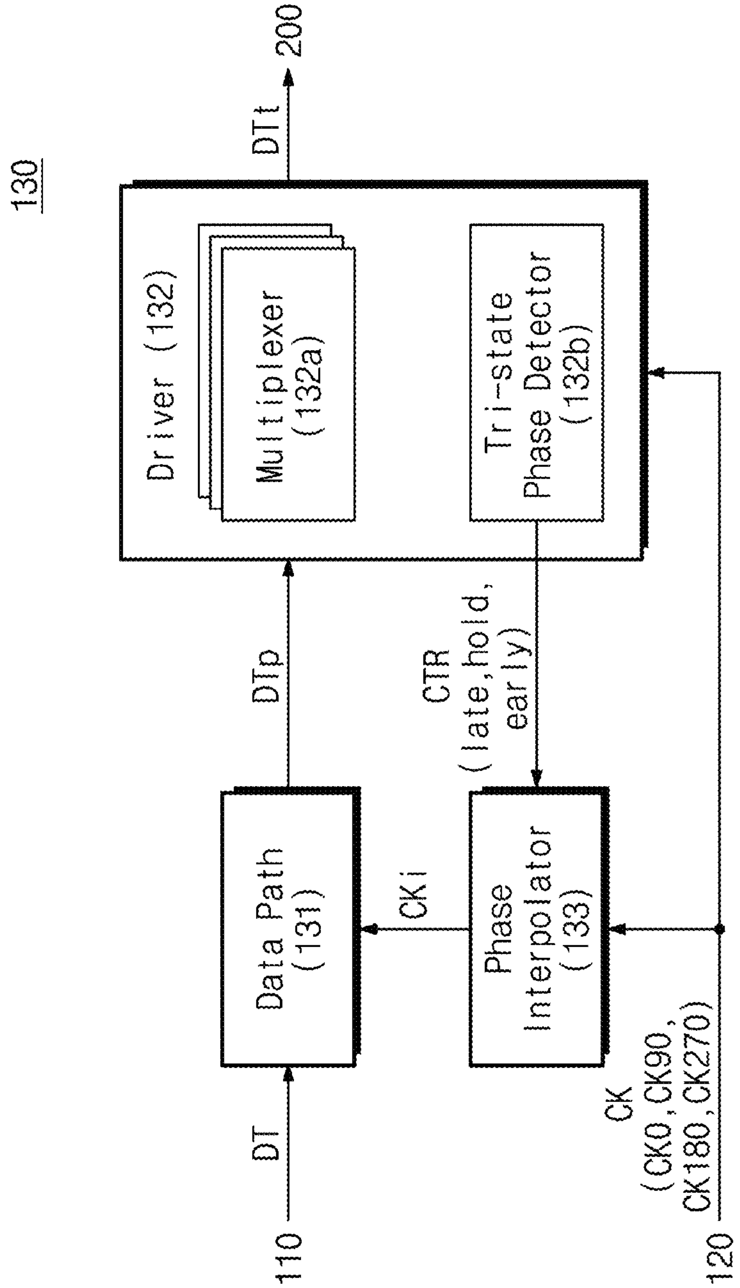
FIG. 4 is a block diagram of a transmitter, according to some example embodiments of the present disclosure.

FIG. 4 is a block diagram of a transmitter, according to some example embodiments of the present disclosure. Referring to FIG. 4, the transmitter 130 may correspond to the transmitter 130 or the transmitter 230 of FIG. 1. The transmitter 130 may include a data path 131, a driver 132, and a phase interpolator 133. The driver 132 may include multiplexers 132*a* and a tri-state phase detector 132*b*.

The transmitter 130 may receive a data signal DT from the data management circuit 110. The transmitter 130 may receive a four-phase clock signal CK from the clock generator 120. The transmitter 130 may provide a transmission data signal DTt to the second communication device 200 through the communication interface circuit 11 of FIG. 1.

The four-phase clock signal CK may include a first clock signal CK0, a second clock signal CK90, a third clock signal CK180, and a fourth clock signal CK270. The first clock signal CK0 may have a reference phase value (e.g., a phase value of 0 degrees). The second clock signal CK90 may have a phase value that is delayed by 90 degrees from the reference phase value. The third clock signal CK180 may have a phase value that is delayed by 180 degrees from the reference phase value. The fourth clock signal CK270 may have a phase value that is delayed by 270 degrees from the reference phase value.

The data path 131 may receive the data signal DT from the data management circuit 110. The data path 131 may include an internal four-phase clock signal CKi from the phase interpolator 133. The internal four-phase clock signal CKi may be generated based on the four-phase clock signal CK by the phase interpolator 133. Similarly to the four-phase clock signal CK, the internal four-phase clock signal CKi may include first to fourth internal clock signals, of which phases are different from each other by 90 degrees.

The data path 131 may generate a path data signal DTp based on the data signal DT and the internal four-phase clock signal CKi. For example, the data path 131 may generate the path data signal DTp by performing a serialization operation, an emphasis operation, or the like based on the data signal DT and the internal four-phase clock signal CKi. The number of path data lines for transmitting the path data signal DTp may be less than the number of data lines for transmitting the data signal DT.

The driver 132 may receive the path data signal DTp from the data path 131. The driver 132 may receive the four-phase clock signal CK from the clock generator 120.

The multiplexers 132*a* of the driver 132 may generate the transmission data signal DTt by performing a multiplexing operation of the path data signal DTp and the four-phase clock signal CK, and may provide the transmission data signal DTt to the second communication device 200. The transmission data signal DTt may have a signal format of a pulse amplitude modulation (PAM)-4 symbol indicating two bit values as one symbol.

The tri-state phase detector 132*b* may replicate the multiplexers 132*a*. For example, the tri-state phase detector 132*b* may replicate at least one of the multiplexers 132*a* so as to process an electrical signal in a physically or structurally similar manner. The phase of the path data signal DTp detected by the tri-state phase detector 132*b* may be similar to the phase of the path data signal DTp to be processed by the replicated multiplexer 132*a*.

The tri-state phase detector 132*b* may provide the phase interpolator 133 with a control signal CTR indicating a first phase state, a second phase state, or a third phase state based on the path data signal DTp and the four-phase clock signal CK. The first phase state, the second phase state, and the third phase state may be referred to as a "late state", a "hold state", and an "early state", respectively.

The late state may indicate that the phase of the path data signal DTp is delayed excessively (e.g., an extent to which interpolation is required or desired) compared to the phase of the four-phase clock signal CK. The hold state may indicate that a phase difference between the path data signal DTp and the four-phase clock signal CK is appropriate (e.g., within operating parameters as may be required or desired, within a threshold, or otherwise does not affect subsequent operations based on timing). The early state may indicate that the phase of the path data signal DTp is excessively earlier (e.g., an extent to which interpolation is required or desired) than the phase of the four-phase clock signal CK.

In some example embodiments, the tri-state phase detector 132*b* may detect the phase of the path data signal DTp based on at least two of the first to fourth clock signals CK0, CK90, CK180, and CK270 of the four-phase clock signal CK.

For example, the path data signal DTp may include a plurality of path bit signals. Among the plurality of path bit signals, a target path bit signal may be processed by the multiplexers 132*a* based on the first clock signal CK0 and the second clock signal CK90. The tri-state phase detector 132*b* may generate a first detection signal based on the target path bit signal and the fourth clock signal CK270, may generate a second detection signal based on the target path bit signal and the first clock signal CK0, and may classify the phase state of the path data signal DTp as one of the late state, the hold state, and the early state based on the first and second detection signals. Detailed descriptions thereof will be described later with reference to FIG. 11.

However, the scope of the present disclosure is not necessarily limited thereto. For example, to detect the phase of the path data signal DTp, other types of clock signals may be used depending on an edge type (e.g., a rising edge or a falling edge), a length of a valid section of the target path bit signal, a required (or desired) length of the setup margin, a required (or desired) length of the hold margin, or the like.

The phase interpolator 133 may receive the four-phase clock signal CK from the clock generator 120. In the initial loop after power is supplied to the electronic system 10 of FIG. 1, the phase interpolator 133 may generate the internal four-phase clock signal CKi based on the four-phase clock signal CK. In the next loop, the phase interpolator 133 may receive the control signal CTR from the tri-state phase detector 132*b*. The phase interpolator 133 may interpolate the internal four-phase clock signal CKi based on the control signal CTR.

For example, the phase interpolator 133 may decrease the delay level of the phase of the internal four-phase clock signal CKi in response to the control signal CTR indicating the late state. The phase interpolator 133 may maintain the delay level of the phase of the internal four-phase clock signal CKi in response to the control signal CTR indicating the hold state. The phase interpolator 133 may increase the delay level of the phase of the internal four-phase clock signal CKi in response to the control signal CTR indicating the early state.

The data path 131 may generate the path data signal DTp based on the internal four-phase clock signal CKi interpolated in a subsequent loop. Accordingly, the driver 132 may receive the path data signal DTp with the reduced skew, or may continuously receive the path data signal DTp with little or no skew.

As described above, according to some example embodiments of the present disclosure, the transmitter 130 may classify the phase state of the path data signal DTp as the late state, the hold state, or the early state based on at least two clock signals, and may interpolate the internal four-phase clock signal CKi according to the classified phase state. Unlike the general transmitter Tx2 of FIG. 3, unnecessary phase interpolation may be suppressed by classifying the phase state of the path data signal DTp with little or no skew as the hold state. Accordingly, the skew between the path data signal DTp and the four-phase clock signal CK may be minimized or reduced, and the setup margin and the hold margin of the path data signal DTp may be maximized or improved. For example, according to some example embodiments, there may be an increase in reliability, operating parameters (e.g., temperature resilience), speed, accuracy, and/or power efficiency of the communicator device based on the above methods. Therefore, the improved devices and methods overcome the deficiencies of the conventional devices and methods while reducing resource consumption, and/or improving data accuracy, operating parameters, and resource allocation (e.g., latency). Further, there is an improvement in user experience in the device by providing the improved process.

Figure 5:
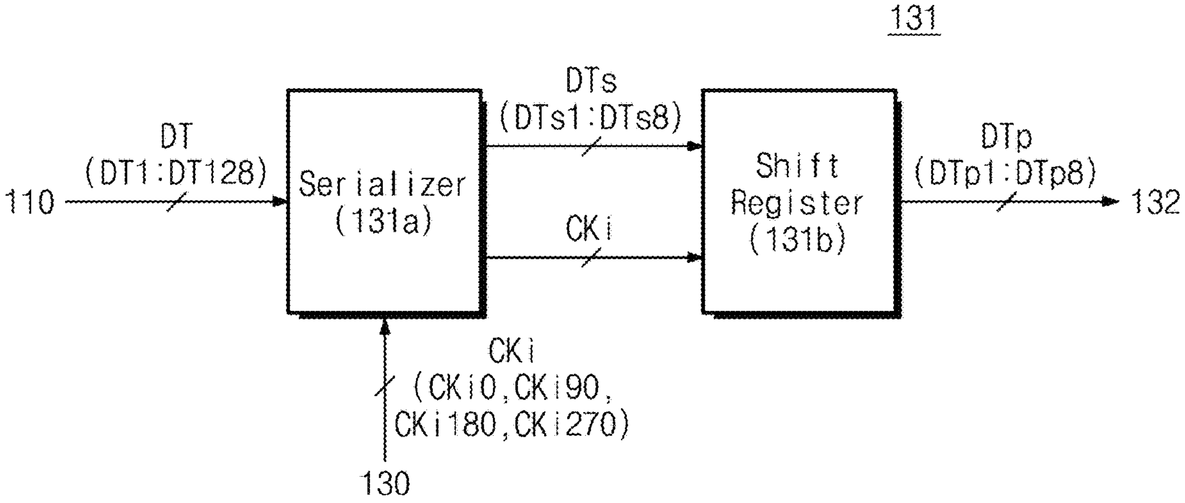
FIG. 5 is a block diagram illustrating the data path of FIG. 4, according to some example embodiments of the present disclosure.

FIG. 5 is a block diagram illustrating the data path of FIG. 4, according to some example embodiments of the present disclosure. Referring to FIGS. 4 and 5, the data path 131 may include a serializer 131*a* and a shift register 131*b*.

The serializer 131*a* may receive the data signal DT from the data management circuit 110. The data signal DT may include first to 128th data bit signals DT1 to DT128. For example, the serializer 131*a* may receive the first to 128th data bit signals DT1 to DT128 from the data management circuit 110 through the first to 128th data lines, respectively.

The serializer 131*a* may receive the internal four-phase clock signal CKi from the phase interpolator 133. The internal four-phase clock signal CKi may include first to fourth internal clock signals CKi0, CKi90, CKi180, and CKi270.

The serializer 131*a* may generate a serialized data signal DTs based on the data signal DT and the internal four-phase clock signal CKi. The serialized data signal DTs may include first to eighth serialized bit signals DTs1 to DTs8. The serializer 131*a* may provide the first to eighth serialized bit signals DTs1 to DTs8 to the shift register 131*b* through first to eighth serialized data lines, respectively. The serializer 131*a* may provide the internal four-phase clock signal CKi to the shift register 131*b*.

The shift register 131*b* may receive the serialized data signal DTs including the first to eighth serialized bit signals DTs1 to DTs8 and the internal four-phase clock signal CKi from the serializer 131*a*. The shift register 131*b* may generate the path data signal DTp based on the serialized data signal DTs and the internal four-phase clock signal CKi. The path data signal DTp may include first to eighth path bit signals DTp1 to DTp8. The shift register 131*b* may provide the path data signal DTp to the driver 132.

For better understanding of the present disclosure, the serializer 131*a* is described as performing a 128-to-8 serialization operation. However, the scope of the present disclosure is not necessarily limited thereto. The number of input signals and the number of output signals of the serialization operation may vary depending on the specifications and implementation method of the data path 131.

Figure 6:
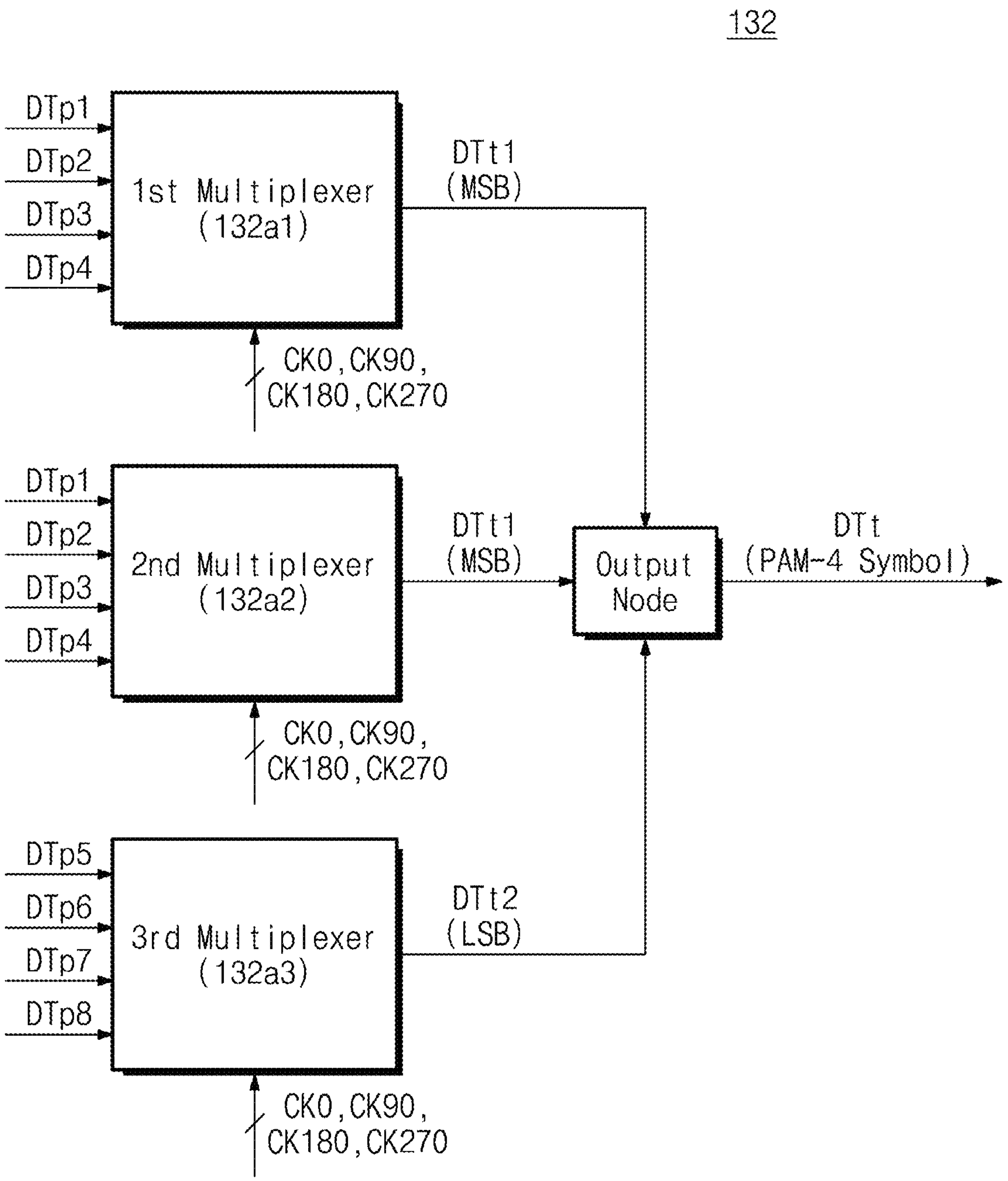
FIG. 6 is a block diagram for describing the driver of FIG. 4, according to some example embodiments of the present disclosure.

FIG. 6 is a block diagram for describing the driver of FIG. 4, according to some example embodiments of the present disclosure. Referring to FIGS. 4 and 6, the driver 132 may include a first multiplexer 132*a*1, a second multiplexer 132*a*2, a third multiplexer 132*a*3, and an output node. The first to third multiplexers 132*a*1, 132*a*2, and 132*a*3 may correspond to the multiplexers 132*a* of FIG. 4. The driver 132 may receive the path data signal DTp including the first to eighth path bit signals DTp1 to DTp8 from the data path 131 of FIG. 5. The driver 132 may receive the four-phase clock signal CK including the first to fourth clock signals CK0, CK90, CK180, and CK270 from the clock generator 120.

The first multiplexer 132*a*1 may receive the first to fourth path bit signals DTp1, DTp2, DTp3, and DTp4 and the first to fourth clock signals CK0, CK90, CK180, and CK270. The first multiplexer 132*a*1 may select one of the first to fourth path bit signals DTp1, DTp2, DTp3, and DTp4 based on the first to fourth clock signals CK0, CK90, CK180, and CK270, and may provide the selected one as a first transmission bit signal DTt1 to the output node. The first transmission bit signal DTt1 may indicate a most significant bit (MSB) of the PAM-4 symbol corresponding to the transmission data signal DTt.

The second multiplexer 132*a*2 may operate similarly to the first multiplexer 132*a*1. Like the first multiplexer 132*a*1, the second multiplexer 132*a*2 may provide the first transmission bit signal DTt1 indicating the MSB of the PAM-4 symbol corresponding to the transmission data signal DTt to the output node.

The third multiplexer 132*a*3 may receive fifth to eighth path bit signals DTp5, DTp6, DTp7, and DTp8 and the first to fourth clock signals CK0, CK90, CK180, and CK270. The third multiplexer 132*a*3 may select one of the fifth to eighth path bit signals DTp5, DTp6, DTp7, and DTp8 based on the first to fourth clock signals CK0, CK90, CK180, and CK270, and may provide the selected one as a second transmission bit signal DTt2 to the output node. The second transmission bit signal DTt2 may indicate the least significant bit (LSB) of the PAM-4 symbol corresponding to the transmission data signal DTt.

The output node may provide the transmission data signal DTt to the second communication device 200 of FIG. 4 based on the first transmission bit signal DTt1 received from the first multiplexer 132*a*1, the first transmission bit signal DTt1 received from the second multiplexer 132*a*2, and the second transmission bit signal DTt2 received from the third multiplexer 132*a*3. The transmission data signal DTt may include the first transmission bit signal DTt1 and the second transmission bit signal DTt2.

For example, two of the first transmission bit signals DTt1 and one of the second transmission bit signals DTt2 may be combined into one electrical signal at the output node, and the combined signal may be referred to as the "transmission data signal DTt". The transmission data signal DTt may have a signal format of a PAM-4 symbol. The PAM-4 symbol may have a MSB and a least significant bit (LSB). The PAM-4 symbol may have symbol values of '00', '01', '10', or '11'. The first number of the symbol values may be referred to as the "most significant bit" or "MSB". The second number of the symbol values may be referred to as the "least significant bit" or "LSB".

For better understanding of the present disclosure, the driver 132 is described as including three 4-to-1 multiplexers. However, the scope of the present disclosure is not necessarily limited thereto. The number of multiplexers and the number of input signals for each multiplexer may vary depending on the number of path bit signals, implementation method, or the like.

Figure 7:
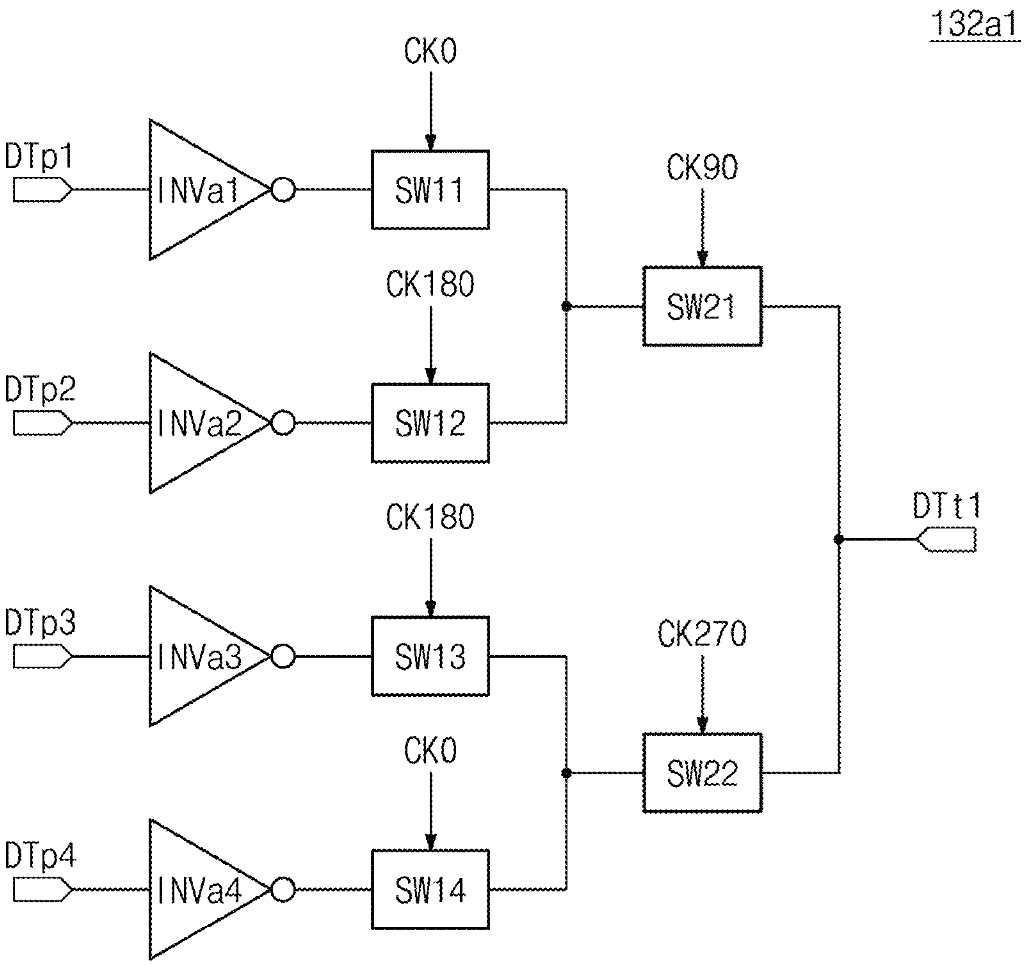
FIG. 7 is a block diagram for describing the multiplexer of FIG. 6, according to some example embodiments of the present disclosure.

FIG. 7 is a block diagram for describing the multiplexer of FIG. 6, according to some example embodiments of the present disclosure. Referring to FIGS. 6 and 7, the first multiplexer 132*a*1 may receive the first to fourth path bit signals DTp1, DTp2, DTp3, and DTp4. The first multiplexer 132*a*1 may receive the first to fourth clock signals CK0, CK90, CK180, and CK270. The first multiplexer 132*a*1 may generate the first transmission bit signal DTt1.

The first multiplexer 132*a*1 may include inverters INVa1, INVa2, INVa3, and INVa4 and switches SW11, SW12, SW13, SW14, SW21, and SW22. The inverters INVa1, INVa2, INVa3, and INVa4 may be omitted, or additional inverters may be connected thereto.

The inverters INVa1, INVa2, INVa3, and INVa4 may provide the first to fourth path bit signals DTp1, DTp2, DTp3, and DTp4 to the switches SW11, SW12, SW13, and SW14, respectively.

The switch SW11 may provide the signal received from the inverter INVa1 to the switch SW21 in response to the first clock signal CK0. For example, the switch SW11 may be turned on while the first clock signal CK0 remains at a logic high level.

The switch SW12 may provide the signal received from the inverter INVa2 to the switch SW21 in response to the third clock signal CK180. For example, the switch SW12 may be turned on while the third clock signal CK180 remains at a logic high level.

The switch SW13 may provide the signal received from the inverter INVa3 to the switch SW22 in response to the third clock signal CK180. For example, the switch SW13 may be turned on while the third clock signal CK180 remains at a logic high level.

The switch SW14 may provide the signal received from the inverter INVa4 to the switch SW22 in response to the first clock signal CK0. For example, the switch SW14 may be turned on while the first clock signal CK0 remains at a logic high level.

The switch SW21 may output the signal received from the switch SW11 or the switch SW12 as the first transmission bit signal DTt1 in response to the second clock signal CK90. For example, the switch SW21 may be turned on while the second clock signal CK90 remains at a logic high level.

The switch SW22 may output the signal received from the switch SW13 or the switch SW14 as the first transmission bit signal DTt1 in response to the fourth clock signal CK270. For example, the switch SW22 may be turned on while the fourth clock signal CK270 is at a logic high level.

In other words, the first multiplexer 132*a*1 may output one of the first to fourth path bit signals DTp1, DTp2, DTp3, and DTp4 as the first transmission bit signal DTt1 by the switches SW11, SW12, SW13, SW14, SW21, and SW22 controlled based on the first to fourth clock signals CK0, CK90, CK180, and CK270.

In more detail, the first multiplexer 132*a*1 may select the first path bit signal DTp1 in response to the first to fourth clock signals CK0, CK90, CK180, and CK270 having a logic high level, a logic high level, a logic low level, and a logic low level, respectively, and may output the selected first path bit signal DTp1 as the first transmission bit signal DTt1. The first path bit signal DTp1 may also be referred to as a "target path bit signal".

The first multiplexer 132*a*1 may select the second path bit signal DTp2 in response to the first to fourth clock signals CK0, CK90, CK180, and CK270 having a logic low level, a logic high level, a logic high level, and a logic low level, respectively, and may output the selected second path bit signal DTp2 as the first transmission bit signal DTt1.

The first multiplexer 132*a*1 may select the third path bit signal DTp3 in response to the first to fourth clock signals CK0, CK90, CK180, and CK270 having a logic low level, a logic low level, a logic high level, and a logic high level, respectively, and may output the selected third path bit signal DTp3 as the first transmission bit signal DTt1.

The first multiplexer 132*a*1 may select the fourth path bit signal DTp4 in response to the first to fourth clock signals CK0, CK90, CK180, and CK270 having a logic high level, a logic low level, a logic low level, and a logic high level, respectively, and may output the selected fourth path bit signal DTp4 as the first transmission bit signal DTt1.

For better understanding of the present disclosure, the first multiplexer 132*a*1 is described. However, the second multiplexer 132*a*2 of FIG. 6 may also be implemented similarly to that described. The third multiplexer 132*a*3 of FIG. 6 may be implemented similarly to that described, based on the fifth to eighth path bit signals DTp5, DTp6, DTp7, and DTp8 instead of the first to fourth path bit signals DTp1, DTp2, DTp3, and DTp4.

Figure 8:
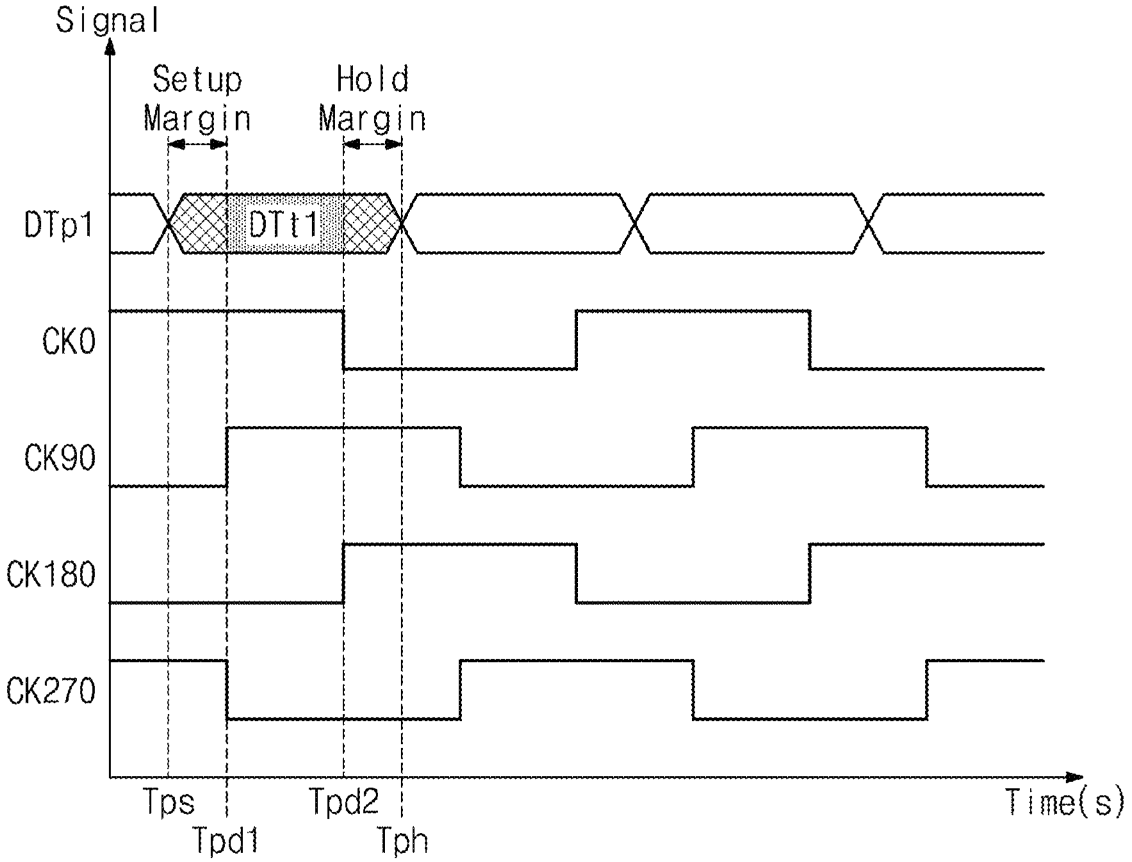
FIG. 8 is a graph illustrating the path bit signals and the clock signals of FIG. 7, according to some example embodiments of the present disclosure.

FIG. 8 is a graph illustrating the path bit signals and the clock signals of FIG. 7, according to some example embodiments of the present disclosure. Referring to FIGS. 7 and 8, the first multiplexer 132*a*1 may select one of the first to fourth path bit signals DTp1, DTp2, DTp3, and DTp4 based on the first to fourth clock signals CK0, CK90, CK180, and CK270. A horizontal axis represents a time, and a vertical axis represents a signal.

While each of the first and second clock signals CK0 and CK90 has a logic high level and each of the third and fourth clock signals CK180 and CK270 has a logic low level, the first multiplexer 132*a*1 may select the first path bit signal DTp1 as the first transmission bit signal DTt1.

Referring to a time point Tps, the first path bit signal DTp1 received from the first multiplexer 132*a*1 may become valid. Before the time point Tps, the first path bit signal DTp1 may not be received, or a signal of the previous cycle may be received.

Referring to a time point Tpd1, because the first and second clock signals CK0 and CK90 respectively have logic high levels, the first multiplexer 132*a*1 may output the first path bit signal DTp1 as the first transmission bit signal DTt1. A time section from the time point Tps to the time point Tpd1 may be referred to as a "setup margin". When the setup margin is sufficient, the possibility that a high frequency clock signal is available or an error bit occurs in the first transmission bit signal DTt1 may be reduced.

Referring to a time point Tpd2, the state of the first clock signal CK0 may be changed from a logic high level to a logic low level. After the time point Tpd2, the first multiplexer 132*a*1 may output the second path bit signal DTp2 as the first transmission bit signal DTt1, and the first path bit signal DTp1 may not be selected.

Referring to a time point Tph, the first path bit signal DTp1 received from the first multiplexer 132*a*1 may become invalid. A time section from the time point Tpd2 to the time point Tph may be referred to as a "hold margin". When the hold margin is sufficient, the possibility that a high frequency clock signal is available or an error bit occurs in the first transmission bit signal DTt1 may be reduced. After the time point Tph, the first path bit signal DTp1 may not be received, or the signal of the next cycle may be received.

As described above, according to some example embodiments of the present disclosure, for a multiplexer to stably select a path bit signal, a section (e.g., a section between the time point Tps and the time point Tph) with a valid path bit signal may be managed to be longer than a section (e.g., a section between the time point Tpd1 and the time point Tpd2) with the selected path bit signal. The illustrated example shows maximizing and/or improving the setup margin and the hold margin by minimizing or reducing a skew. Detailed descriptions of the path bit signal with a skew will be described later with reference to FIG. 11.

Figure 9:
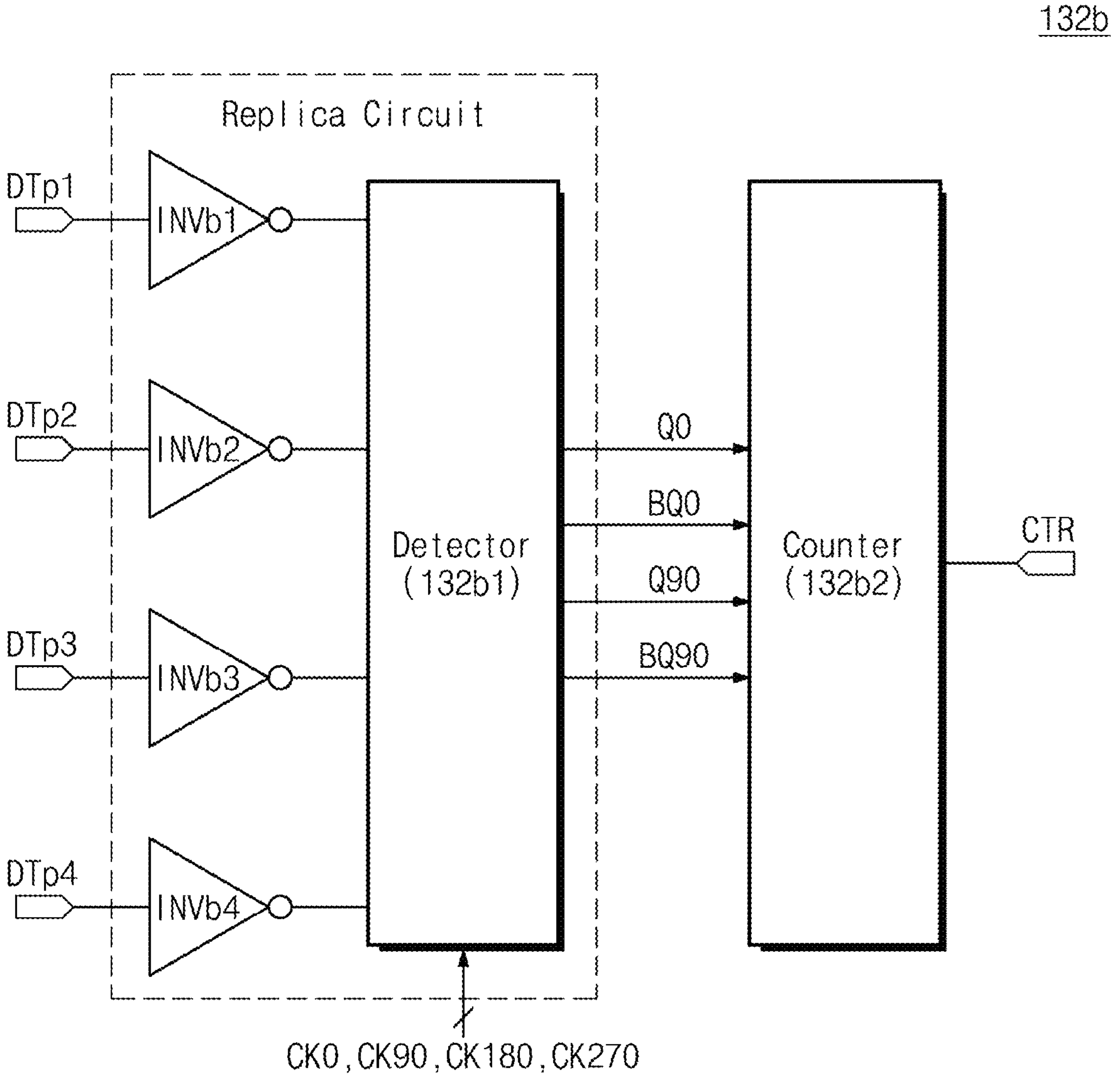
FIG. 9 is a block diagram for describing the tri-state phase detector of FIG. 4, according to some example embodiments of the present disclosure.

FIG. 9 is a block diagram for describing the tri-state phase detector of FIG. 4, according to some example embodiments of the present disclosure. Referring to FIGS. 4 and 9, the tri-state phase detector 132*b* may receive the first to fourth path bit signals DTp1, DTp2, DTp3, and DTp4. The tri-state phase detector 132*b* may receive the first to fourth clock signals CK0, CK90, CK180, and CK270.

The tri-state phase detector 132*b* may include inverters INVb1, INVb2, INVb3, and INVb4, a detector 132*b*1, and a counter 132*b*2. The inverters INVb1, INVb2, INVb3, and INVb4 and the detector 132*b*1 may also be collectively referred to as a "replica circuit". That is, the replica circuit may include the inverters INVb1, INVb2, INVb3, and INVb4 and the detector 132*b*1.

The replica circuit may replicate at least one of the multiplexers 132*a*. For example, the replica circuit may be implemented to be physically or structurally similar to the first multiplexer 132*a*1 of FIG. 7. The inverters INVb1, INVb2, INVb3, and INVb4 may be implemented similarly to the inverters INVa1, INVa2, INVa3, and INVa4 of the first multiplexer 132*a*1 of FIG. 7. The phases of the first to fourth path bit signals DTp1, DTp2, DTp3, and DTp4 detected by the replica circuit may be similar to the phases of the first to fourth path bit signals DTp1, DTp2, DTp3, and DTp4 processed by the first multiplexer 132*a*1 of FIG. 7. However, the present disclosure is not necessarily limited thereto. The replica circuit may also replicate the second multiplexer **132*a*2 or the third multiplexer 132*a*3 of FIG. 6**.

The inverters INVb1, INVb2, INVb3, and INVb4 may provide the first to fourth path bit signals DTp1, DTp2, DTp3, and DTp4 to the detector **132*b*1, respectively. Similarly to the inverters INVa1, INVa2, INVa3, and INVa4, the inverters INVb1, INVb2, INVb3, and INVb4** may be omitted, or an additional inverter may be connected thereto.

The detector **132*b*1 may receive the first to fourth path bit signals DTp1, DTp2, DTp3, and DTp4 and the first to fourth clock signals CK0, CK90, CK180, and CK270. The detector 132*b*1 may generate a first detection signal Q0 and a second detection signal Q90 based on a path bit signal selected from among the first to fourth path bit signals DTp1, DTp2, DTp3, and DTp4 and two clock signals, which correspond to the selected path bit signal, from among the first to fourth clock signals CK0, CK90, CK180, and CK270. Moreover, the detector 132*b*1 may further generate a first complementary detection signal BQ0, which is complementary to (e.g., opposite to a logic level) the first detection signal Q0, and a second complementary detection signal BQ90 complementary to the second detection signal Q90**.

For example, the detector **132*b*1 may generate the first detection signal Q0, which indicates a bit value depending on the validity of the first path bit signal DTp1, based on the rising edge of the fourth clock signal CK270. The detector 132*b*1 may generate the second detection signal Q90, which indicates a bit value depending on the validity of the first path bit signal DTp1, based on the rising edge of the first clock signal CK0. The combination of the first and second detection signals Q0 and Q90 may indicate whether a phase state of the first path bit signal DTp1 is a late state, a hold state, or a busy state. Detailed descriptions thereof will be described later with reference to FIG. 11**.

The counter **132*b*2 may receive the first detection signal Q0 and the second detection signal Q90 from the detector 132*b*1. The counter 132*b*2 may generate the control signal CTR based on the first detection signal Q0 and the second detection signal Q90**. The control signal CTR may indicate the late state, the hold state, or the busy state.

For example, the counter **132*b*2 may receive the first detection signal Q0, the first complementary detection signal BQ0, the second detection signal Q90, and the second complementary detection signal BQ90 from the detector 132*b*1. The counter 132*b*2 may generate the control signal CTR based on logical operations of the first detection signal Q0, the first complementary detection signal BQ0, the second detection signal Q90, and the second complementary detection signal BQ90. Detailed descriptions thereof will be described later with reference to FIG. 10**.

Figure 10:
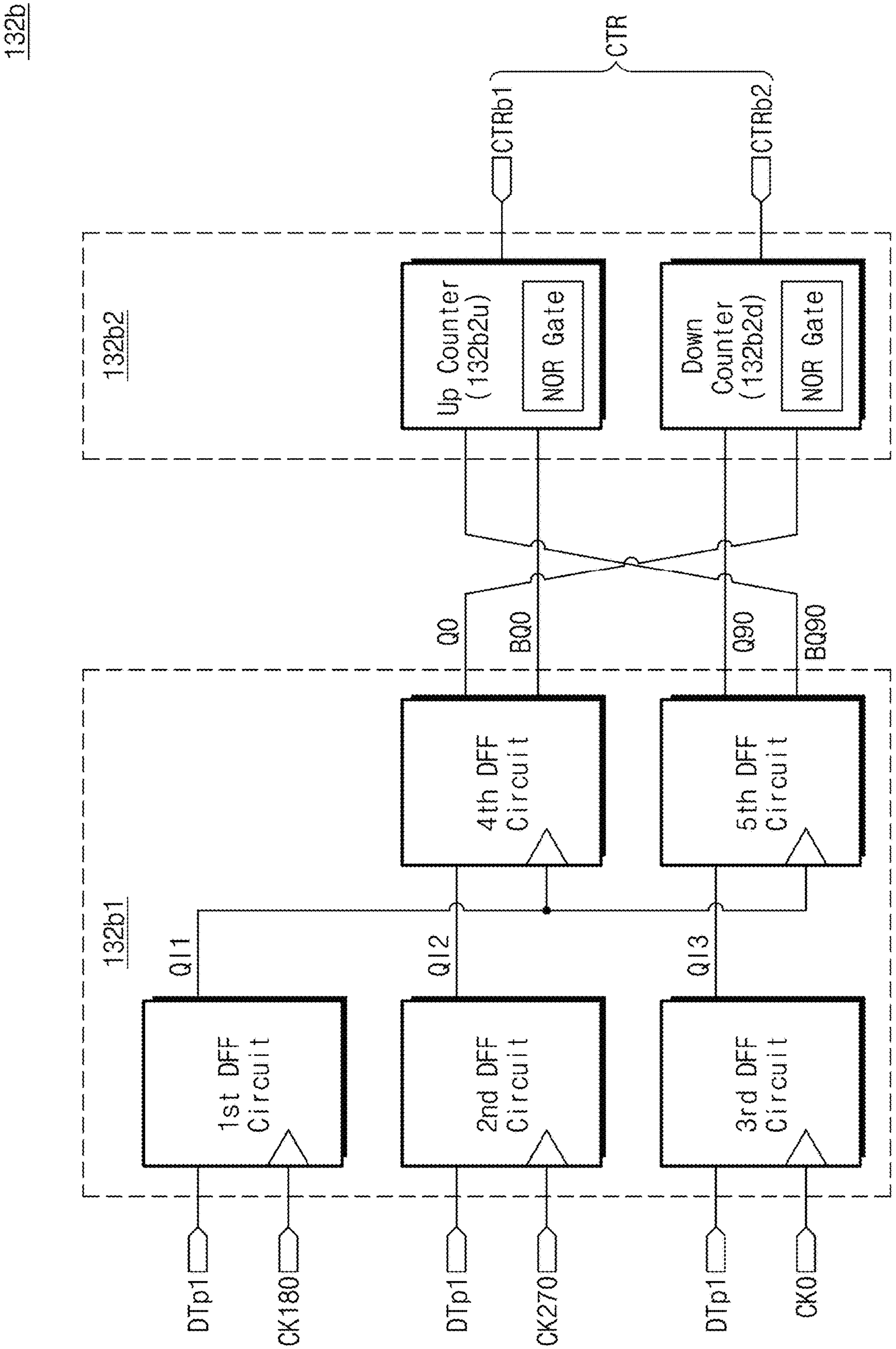
FIG. 10 is a block diagram for describing the tri-state phase detector of FIG. 9, according to some example embodiments of the present disclosure.

FIG. 10 is a block diagram for describing the tri-state phase detector of FIG. 9, according to some example embodiments of the present disclosure. Referring to FIGS. 9 and 10, the tri-state phase detector **132*b* may include the detector 132*b*1 and the counter 132*b*2**.

The detector **132*b*1 may generate the first detection signal Q0, the first complementary detection signal BQ0, the second detection signal Q90, and the second complementary detection signal BQ90 based on the first path bit signal DTp1, the first clock signal CK0, the third clock signal CK180, and the fourth clock signal CK270. The counter 132*b*2 may generate the control signal CTR based on the first complementary detection signal BQ0, the second detection signal Q90, and the second complementary detection signal BQ90. The control signal CTR may include a first control bit signal CTRb1 and a second control bit signal CTRb2**.

The detector **132*b*1** may include a first D Flip-Flop (DFF) circuit, a second DFF circuit, a third DFF circuit, a fourth DFF circuit, and a fifth DFF circuit. On the basis of a signal received at a clock input terminal, each of the first to fifth DFF circuits may output an output signal, which correspond to an input signal received at a D input terminal, at the Q output terminal, and may output a signal, which is complementary to the Q output terminal, at a complementary Q output terminal.

The first DFF circuit may output a first internal detection signal Q11 corresponding to the first path bit signal DTp1, which is received at the D input terminal, at a Q output terminal based on the third clock signal CK180 received at a clock input terminal. The complementary Q output terminal of the first DFF circuit may be deactivated.

The second DFF circuit may output a second internal detection signal Q12 corresponding to the first path bit signal DTp1, which is received at the D input terminal, at a Q output terminal based on the fourth clock signal CK270 received at a clock input terminal. The complementary Q output terminal of the second DFF circuit may be deactivated.

The third DFF circuit may output a third internal detection signal QI3 corresponding to the first path bit signal DTp1, which is received at the D input terminal, at a Q output terminal based on the first clock signal CK0 received at a clock input terminal. The complementary Q output terminal of the third DFF circuit may be deactivated.

The fourth DFF circuit may output the first detection signal Q0 corresponding to the second internal detection signal Q12, which is received at the D input terminal, at a Q output terminal based on the first internal detection signal QI1 received at a clock input terminal. The fourth DFF circuit may output the first complementary detection signal BQ0, which is complementary to the first detection signal Q0, at a complementary Q output terminal.

The fifth DFF circuit may output the second detection signal Q90 corresponding to the third internal detection signal Q13, which is received at the D input terminal, at the Q output terminal based on the first internal detection signal QI1 received at a clock input terminal. The fifth DFF circuit may output the second complementary detection signal BQ90, which is complementary to the second detection signal Q90, at a complementary Q output terminal.

The counter **132*b*2 may include an up counter 132*b*2*u* and a down counter 132*b*2*d*. Each of the up counter 132*b*2*u* and the down counter 132*b*2*d*** may include a NOR gate.

The up counter **132*b*2*u* may generate the first control bit signal CTRb1 of the control signal CTR based on a NOR operation of the first complementary detection signal BQ0 and the second complementary detection signal BQ90. When the first control bit signal CTRb1** has a logic high level (e.g., a logic value '1'), the control signal CTR may indicate the early state.

The down counter **132*b*2*d* may generate the second control bit signal CTRb2 of the control signal CTR based on a NOR operation of the first detection signal Q0 and the second detection signal Q90. When the second control bit signal CTRb2 has a logic high level (e.g., a logic value '1'), the control signal CTR may indicate the late state. Detailed descriptions thereof will be described later with reference to FIG. 12**.

Figure 11:
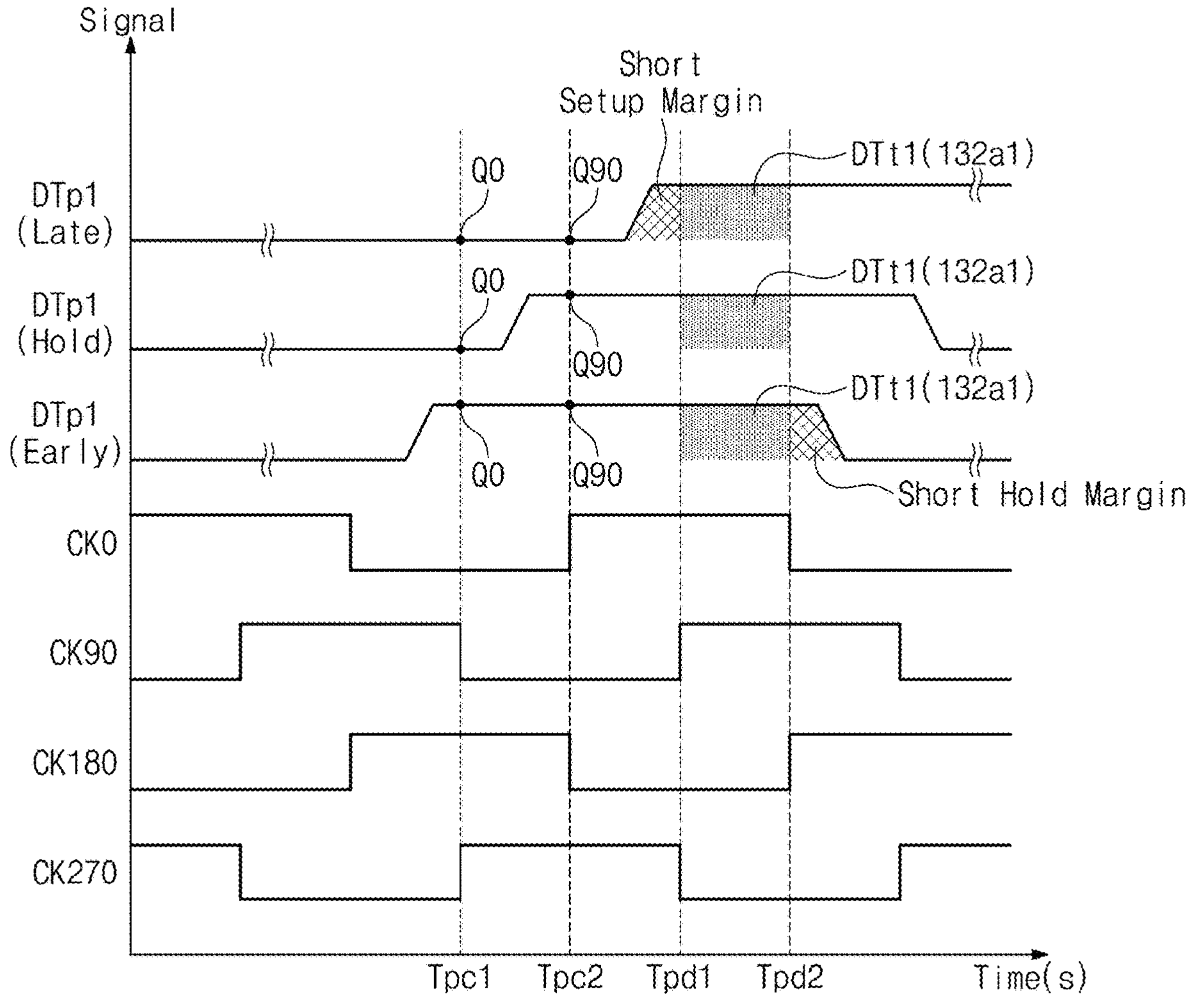
FIG. 11 is a graph illustrating the path bit signals and the clock signals of FIG. 10, according to some example embodiments of the present disclosure.

FIG. 11 is a graph illustrating the path bit signals and the clock signals of FIG. 10, according to some example embodiments of the present disclosure. Referring to FIGS. 10 and 11, the tri-state phase detector 132*b* may classify the phase state of the first path bit signal DTp1 as a late state, a hold state, or an early state based on the first path bit signal DTp1, the first clock signal CK0, and the fourth clock signal CK270. A horizontal axis represents a time, and a vertical axis represents a signal.

The first path bit signal DTp1 may correspond to the first clock signal CK0 and the second clock signal CK90. For example, the first path bit signal DTp1 may be selected as the first transmission bit signal DTt1 (e.g., part of the transmission data signal) by the first multiplexer 132*a*1 of FIG. 7 while each of the first and second clock signals CK0 and CK90 has a logic high level.

When the phase of the first path bit signal DTp1 is delayed (e.g., a late state), the tri-state phase detector 132*b* may generate the first detection signal Q0, which indicates a logic low level (e.g., a logic value '0'), based on the first path bit signal DTp1 and the rising edge of the fourth clock signal CK270 at a time point Tpc1. The tri-state phase detector 132*b* may generate the second detection signal Q90, which indicates a logic low level (e.g., a logic value '0'), based on the first path bit signal DTp1 and the rising edge of the first clock signal CK0 at a time point Tpc2.

In this case, the phase state of the first path bit signal DTp1 may be classified as a late state. In the late state, a setup margin may be short. The setup margin of the next loop may be increased by adjusting the phase of the next loop so as to be faster by the phase interpolator 133 of FIG. 4.

When the phase of the first path bit signal DTp1 is appropriate (e.g., a hold state), the tri-state phase detector 132*b* may generate the first detection signal Q0, which indicates a logic low level (e.g., a logic value '0'), based on the first path bit signal DTp1 and the rising edge of the fourth clock signal CK270 at the time point Tpc1. The tri-state phase detector 132*b* may generate the second detection signal Q90, which indicates a logic high level (e.g., a logic value '1'), based on the first path bit signal DTp1 and the rising edge of the first clock signal CK0 at a time point Tpc2.

In this case, the phase state of the first path bit signal DTp1 may be classified as a hold state. In the hold state, both a setup margin and a hold margin may be sufficient. The phase interpolator 133 in FIG. 4 may not adjust the phase of the next loop. The proper phase of the first path bit signal DTp1 may be maintained.

When the phase of the first path bit signal DTp1 is fast (e.g., an early state), the tri-state phase detector 132*b* may generate the first detection signal Q0, which indicates a logic high level (e.g., a logic value '1'), based on the first path bit signal DTp1 and the rising edge of the fourth clock signal CK270 at a time point Tpc1. The tri-state phase detector 132*b* may generate the second detection signal Q90, which indicates a logic high level (e.g., a logic value '1'), based on the first path bit signal DTp1 and the rising edge of the first clock signal CK0 at a time point Tpc2.

In this case, the phase state of the first path bit signal DTp1 may be classified as the early state. In the early state, the hold margin may be short. The hold margin of the next loop may be increased by adjusting the phase of the next loop so as to be slower by the phase interpolator 133 of FIG. 4.

For better understanding of the present disclosure, the tri-state phase detector 132*b* is described as detecting the phase state of the first path bit signal DTp1 based on the first path bit signal DTp1, the first clock signal CK0, and the fourth clock signal CK270, but the present disclosure is not necessarily limited thereto.

For example, depending on design changes, the tri-state phase detector 132*b* may generate a detection signal based on a falling edge instead of a rising edge; the length of a valid section of the first path bit signal DTp1 may be changed; the required (or desired) length of the setup margin may be changed; the required (or desired) length of the hold margin may be changed; and/or another path bit signal may be used instead of the first path bit signal DTp1. Accordingly, instead of the first and fourth clock signals CK0 and CK270, other clock signals may be used to generate the first and second detection signals Q0 and Q90.

FIG. 12 is a table for describing the detection signal and the control signal of FIG. 10, according to some example embodiments of the present disclosure. Referring to FIG. 10 and FIG. 12, the detector 132*b*1 may generate the first detection signal Q0 and the second detection signal Q90. The up counter 132*b*2*u* may generate the first control bit signal CTRb1 based on the first detection signal Q0 and the second detection signal Q90. The down counter 132*b*2*d* may generate the second control bit signal CTRb2 based on the first detection signal Q0 and the second detection signal Q90.

When the first and second detection signals Q0 and Q90 respectively have logic values '0' and '0', the phase state of the first path bit signal DTp1 may be classified as a late state. The up counter 132*b*2*u* may generate the first control bit signal CTRb1, which indicates a logic value '0', based on the NOR operation of the first and second complementary detection signals BQ0 and BQ90. The down counter 132*b*2*d* may generate the second control bit signal CTRb2, which indicates a logic value '1', based on the NOR operation of the first and second detection signals Q0 and Q90.

This case may mean that a data signal is slower than a clock signal. For example, the phase of the path data signal DTp in FIG. 4 may be slower than the phase of the four-phase clock signal CK. The phase interpolator 133 may interpolate the phase of the internal four-phase clock signal CKi to become fast based on the second control bit signal CTRb2 having a logic value '1'.

When the first and second detection signals Q0 and Q90 respectively have logic values '0' and '1', the phase state of the first path bit signal DTp1 may be classified as a hold state. The up counter 132*b*2*u* may generate the first control bit signal CTRb1, which indicates a logic value '0', based on the NOR operation of the first and second complementary detection signals BQ0 and BQ90. The down counter 132*b*2*d* may generate the second control bit signal CTRb2, which indicates a logic value '0', based on the NOR operation of the first and second detection signals Q0 and Q90.

This case may mean that the timing of the data signal is appropriate. For example, the path data signal DTp and the four-phase clock signal CK in FIG. 4 may have no or substantially no skew or the skew may be so small that interpolation is unnecessary or not desired. For example, within operating parameters as may be required or desired, within a threshold, or otherwise does not affect subsequent operations based on timing. The up counter 132*b*2*u* and the down counter 132*b*2*d* may not allow the phase interpolator 133 to interpolate a phase. The phase interpolator 133 may maintain the phase set in the previous loop.

When the first and second detection signals Q0 and Q90 respectively have logic values '1' and '0', the phase state of the first path bit signal DTp1 may not be classified. In this case, it means that an error is longer than the period of the clock signal. This case is not handled in the present disclosure. Even when this case occurs, the up counter **132*b*2*u* and the down counter 132*b*2*d* may not allow the phase interpolator 133 of FIG. 4 to interpolate the phase. The phase interpolator 133** may maintain the phase set in the previous loop.

When the first and second detection signals Q0 and Q90 respectively have logic values '1' and '1', the phase state of the first path bit signal DTp1 may be classified as an early state. The up counter **132*b*2*u* may generate the first control bit signal CTRb1, which indicates a logic value '1', based on the NOR operation of the first and second complementary detection signals BQ0 and BQ90. The down counter 132*b*2*d* may generate the second control bit signal CTRb2, which indicates a logic value '0', based on the NOR operation of the first and second detection signals Q0 and Q90**.

This case may mean that the data signal is faster than the clock signal. For example, the phase of the path data signal DTp in FIG. 4 may be faster than the phase of the four-phase clock signal CK. The phase interpolator 133 may interpolate the phase of the internal four-phase clock signal CKi to become slow based on the first control bit signal CTRb1 having a logic value '1'.

Figure 13:
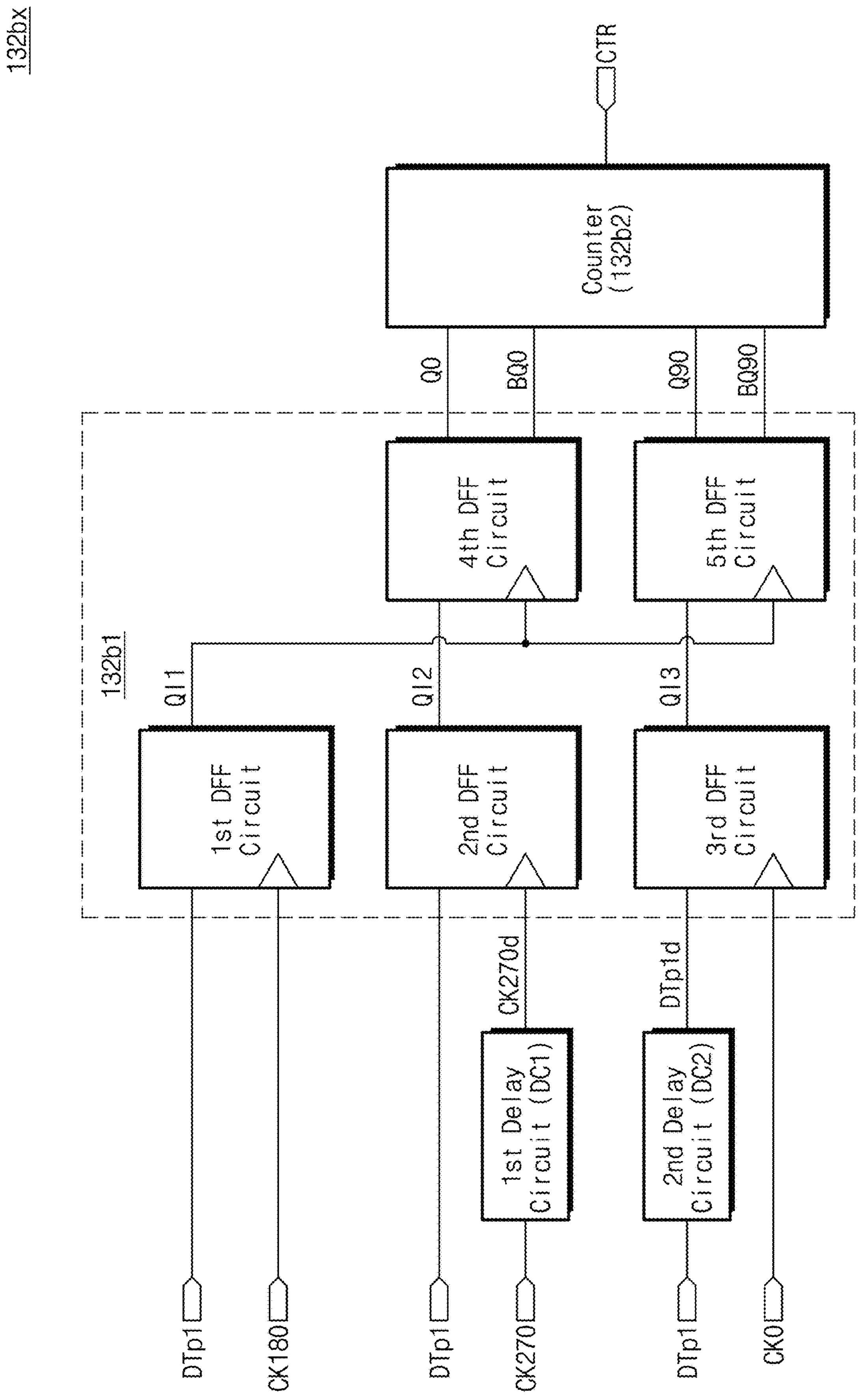
FIG. 13 is a block diagram for describing the tri-state phase detector, according to some example embodiments of the present disclosure.

FIG. 13 is a block diagram for describing the tri-state phase detector, according to some example embodiments of the present disclosure. Referring to FIG. 13, a tri-state phase detector **132*bx* may generate the control signal CTR based on the first path bit signal DTp1, the first clock signal CK0, the third clock signal CK180, and the fourth clock signal CK270. The tri-state phase detector 132*bx* may correspond to the tri-state phase detector 132*b* of FIGS. 4, 9, and 10**.

The tri-state phase detector **132*bx* may include a first delay circuit DC1, a second delay circuit DC2, the detector 132*b*1, and the counter 132*b*2. The detector 132*b*1 may include first to fifth DFF circuits. The features of the first to fifth DFF circuits and the counter 132*b*2 are similar to the features of the first to fifth DFF circuits and the counter 132*b*2 of FIG. 10**, and thus a detailed description thereof is omitted.

The first delay circuit DC1 may receive the fourth clock signal CK270, may generate a delayed fourth clock signal CK**270*d* based on the fourth clock signal CK270, and may provide the delayed fourth clock signal CK270*d* to a clock input terminal of the second DFF circuit. The first delay circuit DC1** may be implemented with an inverter, a buffer, or the like.

The second delay circuit DC2 may receive the first path bit signal DTp1, may generate a delayed first path bit signal DTp**1*d* based on the first path bit signal DTp1, and may provide the delayed first path bit signal DTp1*d* to a D input terminal of the third DFF circuit. From the perspective of the delayed first path bit signal DTp1*d* and the third DFF circuit, the phase of the first clock signal CK0 may be fast. The second delay circuit DC2** may be implemented with an inverter, a buffer, or the like.

Figure 14:
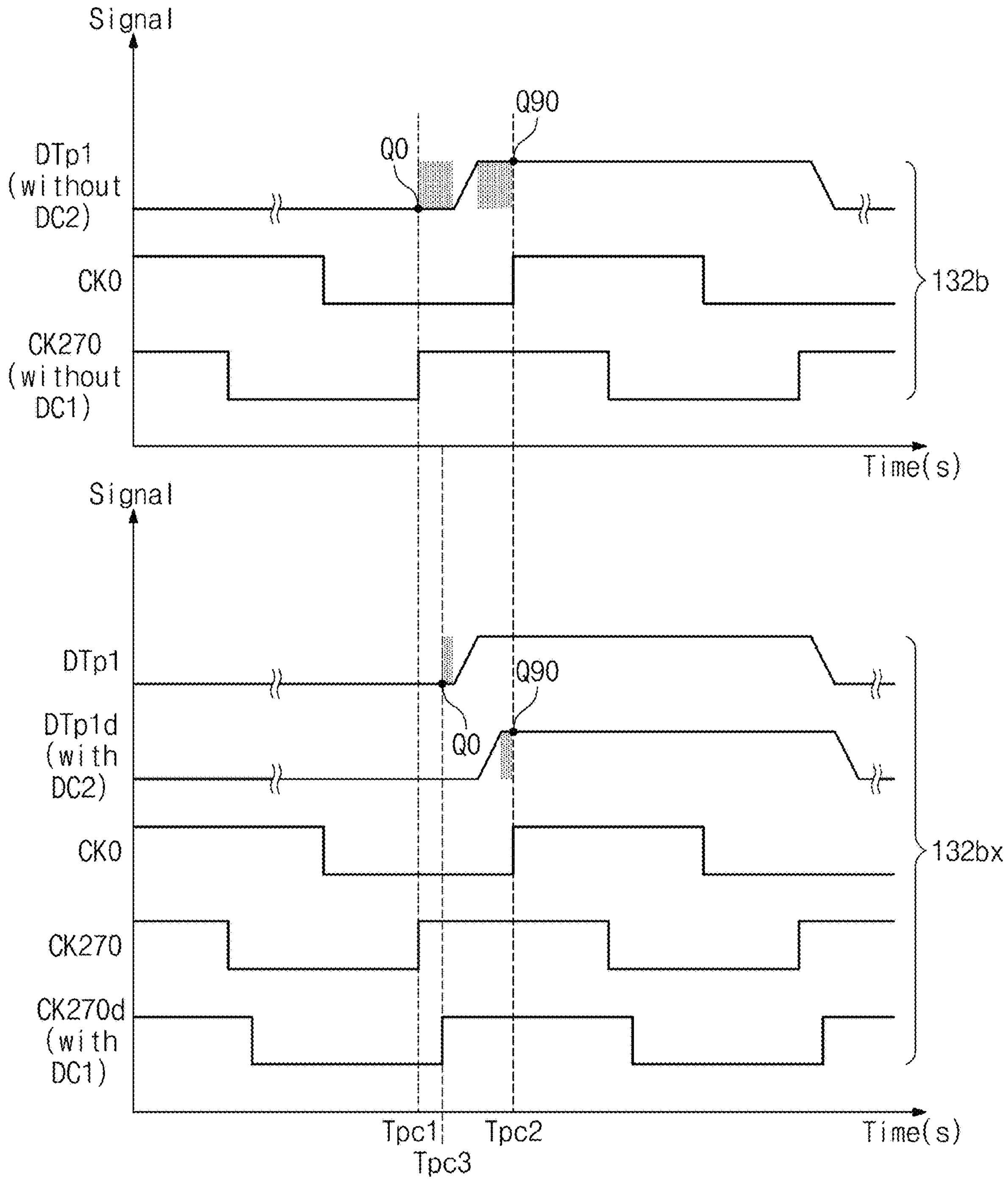
FIG. 14 is a graph illustrating the path bit signal and the clock signal of FIG. 13, according to some example embodiments of the present disclosure.

FIG. 14 is a graph illustrating the path bit signal and the clock signal of FIG. 13, according to some example embodiments of the present disclosure. Referring to FIGS. 10, 13, and 14, signals of the tri-state phase detector **132*b* and the tri-state phase detector 132*bx* are described. The tri-state phase detector 132*b* may not include the first and second delay circuits DC1 and DC2, and thus the delayed fourth clock signal CK270*d* and the delayed first path bit signal DTp1*d* may not be used. The tri-state phase detector 132*bx* may include the first and second delay circuits DC1 and DC2, and thus the delayed fourth clock signal CK270*d* and the delayed first path bit signal DTp1*d*** may be used. A horizontal axis represents a time, and a vertical axis represents a signal.

Referring to the graph of the tri-state phase detector **132*b*, the tri-state phase detector 132*b* may generate the first detection signal Q0 based on the first path bit signal DTp1 and the rising edge of the fourth clock signal CK270 at the time point Tpc1. The tri-state phase detector 132*b* may generate the second detection signal Q90 based on the first path bit signal DTp1 and the rising edge of the first clock signal CK0 at a time point Tpc2**.

In this case, the time point Tpc1 may depend on the fourth clock signal CK270, and the time point Tpc2 may depend on the first clock signal CK0. Within a time section between the time points Tpc1 and Tpc2, the tri-state phase detector **132*b* may find it difficult to detect a skew of the first path bit signal DTp1. The time section between the time points Tpc1 and Tpc2 may also be referred to as a "resolution of the tri-state phase detector 132*b*". Depending on the resolution of the tri-state phase detector 132*b***, a section where it is difficult to detect a skew is displayed as a shaded area. As the shaded area is larger, the resolution may be lower.

Next, referring to the graph of the tri-state phase detector **132*bx*, the tri-state phase detector 132*bx* may generate the first detection signal Q0 based on the first path bit signal DTp1 and the rising edge of the delayed fourth clock signal CK270*d* at a time point Tpc3. The tri-state phase detector 132*bx* may generate the second detection signal Q90 based on the delayed first path bit signal DTp1*d* and the rising edge of the first clock signal CK0 at the time point Tpc2**.

In this case, the time point Tpc3 may depend on the delayed fourth clock signal CK**270*d* delayed by the first delay circuit DC1. Similar results to those obtained by analyzing the first path bit signal DTp1 at a time point earlier than time point Tpc2 may be obtained by analyzing the delayed first path bit signal DTp1*d* delayed by the second delay circuit DC2 at the time point Tpc2. Depending on the resolution of the tri-state phase detector 132*bx***, a section where it is difficult to detect a skew is displayed as a shaded area.

That is, the shaded area of the tri-state phase detector **132*bx* may be narrower than that of the tri-state phase detector 132*b*. In other words, the resolution of the tri-state phase detector 132*bx* may be higher than that of the tri-state phase detector 132*b***.

As described above, according to some example embodiments of the present disclosure, the resolution of the tri-state phase detector **132*bx* may be increased by using the delayed fourth clock signal CK270*d* delayed by the first delay circuit DC1 and the delayed first path bit signal DTp1*d* delayed by the second delay circuit DC2. The tri-state phase detector 132*bx* may strictly detect a hold state depending on the increased resolution and may perform phase interpolation based on the first path bit signal DTp1** classified as a late state or an early state, thereby maximizing and/or improving a setup margin and a hold margin.

Figure 15:
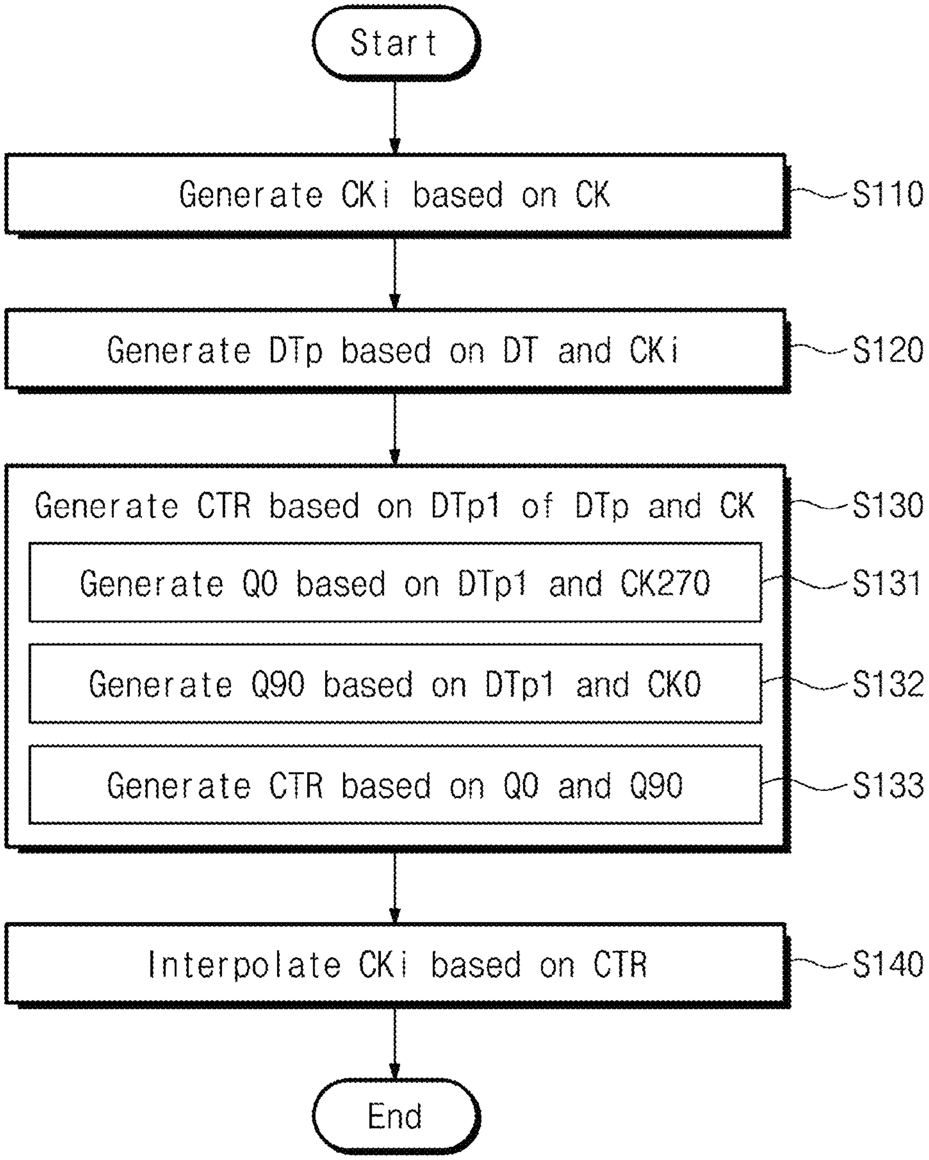
FIG. 15 is a flowchart for describing a method of operating a transmitter, according to some example embodiments of the present disclosure.

FIG. 15 is a flowchart for describing a method of operating a transmitter, according to some example embodiments of the present disclosure. Referring to FIG. 15, a transmitter may receive the data signal DT from a data management circuit. The transmitter may receive the four-phase clock signal CK from a clock generator. The transmitter may communicate with a receiver of an external communication device through a communication interface circuit.

In operation S110, the transmitter may generate the internal four-phase clock signal CKi based on the four-phase clock signal CK. The four-phase clock signal CK may include the first to fourth clock signals CK0, CK90, CK180, and CK270. The internal four-phase clock signal CKi may include first to fourth internal clock signals CKi0, CKi90, CKi180, and CKi270. The first to fourth internal clock signals CKi0, CKi90, CKi180, and CKi270 may correspond to the first to fourth clock signals CK0, CK90, CK180, and CK270, respectively.

In operation S120, the transmitter may generate the path data signal DTp based on the data signal DT and the internal four-phase clock signal CKi.

In operation S130, the transmitter may generate the control signal CTR based on the first path bit signal DTp1 of the path data signal DTp and the four-phase clock signal CK. The control signal CTR may indicate a first phase state, a second phase state, or a third phase state. For example, the first phase state, the second phase state, and the third phase state may indicate a late state, a hold state, and an early state, respectively.

In some example embodiments, operation S130 may include operation S131, operation S132, and/or operation S133. In operation S131, the transmitter may generate the first detection signal Q0 based on the first path bit signal DTp1 and the rising edge of the fourth clock signal CK270. In operation S132, the transmitter may generate the second detection signal Q90 based on the first path bit signal DTp1 and the rising edge of the first clock signal CK0. In operation S133, the transmitter may generate the control signal CTR based on the first and second detection signals Q0 and Q90.

In operation S140, the transmitter may interpolate the internal four-phase clock signal CKi based on the control signal CTR. The interpolated internal four-phase clock signal CKi may be used to generate the path data signal DTp in the next loop.

The above description refers to detailed embodiments for carrying out the present disclosure. The present disclosure may include embodiments in which a design is changed simply or which are easily changed, as well as some example embodiments described above. In addition, technologies that are easily changed and implemented by using some example embodiments as disclosed above may be included in the present disclosure. While the present disclosure has been described with reference to some example embodiments described above, it will be apparent to those of ordinary skill in the art that various changes and modifications may be made thereto without departing from the spirit and scope of the present disclosure as set forth in the following claims.

According to some example embodiments of the present disclosure, it is possible to provide transmitters for interpolating a clock signal, communication devices including the same, and methods of operating the same.

Moreover, according to some example embodiments of the present disclosure, a setup margin and a hold margin may be maximized and/or improved by classifying a phase state as a late state, a hold state, or an early state based on at least two clock signals and interpolating a clock signal depending on the classified phase state. The resolution of a phase detector may be improved by delaying a clock signal or a path bit signal by a delay circuit.

Any or all of the elements described with reference to the figures may communicate with any or all other elements described with reference to figures. For example, any element may engage in one-way and/or two-way and/or broadcast communication with any or all other elements in the figures, to transfer and/or exchange and/or receive information such as but not limited to data and/or commands, in a manner such as in a serial and/or parallel manner, via a bus such as a wireless and/or a wired bus (not illustrated). The information may be in encoded various formats, such as in an analog format and/or in a digital format.

When the terms "about" or "substantially" are used in this specification in connection with a numerical value, it is intended that the associated numerical value includes a manufacturing, observational, or operational tolerance (e.g., ±10%) around the stated numerical value. Moreover, when the words "generally" and "substantially" are used in connection with time and timing, it is intended that precision of the time as generally observable as within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As described herein, any electronic devices and/or portions thereof according to any of the example embodiments may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a DRAM device, storing a program of instructions, and a processor (e.g., CPU) configured to execute the program of instructions to implement the functionality and/or methods performed by some or all of any devices, systems, modules, units, controllers, circuits, architectures, and/or portions thereof according to any of the example embodiments, and/or any portions thereof.

While the present disclosure has been described with reference to some example embodiments thereof, it will be apparent to those of ordinary skill in the art that various changes and modifications may be made thereto without departing from the spirit and scope of the present disclosure as set forth in the following claims.

What is claimed is:

1. A transmitter comprising:

a phase interpolator configured to generate an internal four-phase clock signal based on a four-phase clock signal including a first clock signal, a second clock signal, a third clock signal, and a fourth clock signal;

a data path configured to generate a path data signal based on a data signal and the internal four-phase clock signal; and a driver configured to generate a transmission data signal based on the path data signal and the four-phase clock signal, and provide the phase interpolator with a control signal indicating a first phase state, a second phase state, or a third phase state based on a first path bit signal of the path data signal, the first clock signal, and the fourth clock signal, and wherein the phase interpolator is further configured to interpolate the internal four-phase clock signal based on the control signal.

2. The transmitter of claim 1, wherein the first clock signal, the second clock signal, the third clock signal, and the fourth clock signal have a first phase value, a second phase value delayed by 90 degrees from the first phase value, a third phase value delayed by 180 degrees from the first phase value, and a fourth phase value delayed by 270 degrees from the first phase value, respectively.

3. The transmitter of claim 1, wherein the first phase state indicates a late state of the path data signal, the second phase state indicates a hold state of the path data signal, and the third phase state indicates an early state of the path data signal.

4. The transmitter of claim 1, wherein the driver is configured to:

generate a first detection signal based on the first path bit signal and a rising edge of the fourth clock signal;

generate a second detection signal based on the first path bit signal and a rising edge of the first clock signal; and generate the control signal based on the first detection signal and the second detection signal.

5. The transmitter of claim 4, wherein the driver is configured to:

generate the control signal indicating the first phase state in response to the first detection signal having a logic low level and the second detection signal having the logic low level;

generate the control signal indicating the second phase state in response to the first detection signal having the logic low level and the second detection signal having a logic high level; and generate the control signal indicating the third phase state in response to the first detection signal having the logic high level and the second detection signal having the logic high level.

6. The transmitter of claim 1, wherein the driver includes:

at least one multiplexer configured to generate the transmission data signal based on the path data signal and the four-phase clock signal; and a tri-state phase detector configured to generate the control signal based on the path data signal and the four-phase clock signal.

7. The transmitter of claim 6, wherein the tri-state phase detector includes:

a replica circuit configured to replicate the at least one multiplexer and to generate a first detection signal and a second detection signal based on the first path bit signal and the four-phase clock signal; and a counter configured to generate the control signal based on the first detection signal and the second detection signal.

8. The transmitter of claim 7, wherein the replica circuit includes a detector, wherein the detector includes:

a first D Flip-Flop (DFF) circuit configured to output a first internal detection signal corresponding to the first path bit signal based on the third clock signal;

a second DFF circuit configured to output a second internal detection signal corresponding to the first path bit signal based on the fourth clock signal;

a third DFF circuit configured to output a third internal detection signal corresponding to the first path bit signal based on the first clock signal;

a fourth DFF circuit configured to output the first detection signal corresponding to the second internal detection signal and a first complementary detection signal complementary to the first detection signal based on the first internal detection signal; and a fifth DFF circuit configured to output the second detection signal corresponding to the third internal detection signal and a second complementary detection signal complementary to the second detection signal based on the first internal detection signal, and wherein the counter includes:

an up counter configured to generate a first control bit signal of the control signal based on a NOR operation of the first complementary detection signal and the second complementary detection signal; and a down counter configured to generate a second control bit signal of the control signal based on a NOR operation of the first detection signal and the second detection signal.

9. The transmitter of claim 8, wherein the tri-state phase detector further includes:

a first delay circuit configured to receive the fourth clock signal and to provide a delayed fourth clock signal to the second DFF circuit; and a second delay circuit configured to receive the first path bit signal and to provide a delayed first path bit signal to the third DFF circuit.

10. The transmitter of claim 6, wherein the path data signal includes the first path bit signal, a second path bit signal, a third path bit signal, a fourth path bit signal, a fifth path bit signal, a sixth path bit signal, a seventh path bit signal, and an eighth path bit signal, the transmission data signal includes a first transmission bit signal and a second transmission bit signal, and the at least one multiplexer includes:

a first multiplexer configured to provide an output node with one selected from the first path bit signal, the second path bit signal, the third path bit signal, and the fourth path bit signal as the first transmission bit signal based on the first clock signal, the second clock signal, the third clock signal, and the fourth clock signal;

a second multiplexer configured to provide the output node with one selected from the first path bit signal, the second path bit signal, the third path bit signal, and the fourth path bit signal as the first transmission bit signal based on the first clock signal, the second clock signal, the third clock signal, and the fourth clock signal; and a third multiplexer configured to provide the output node with one selected from the fifth path bit signal, the sixth path bit signal, the seventh path bit signal, and the eighth path bit signal as the second transmission bit signal based on the first clock signal, the second clock signal, the third clock signal, and the fourth clock signal.

11. The transmitter of claim 10, wherein the first multiplexer is configured to:

select the first path bit signal in response to the first clock signal, the second clock signal, the third clock signal, and the fourth clock signal respectively having a logic high level, the logic high level, a logic low level, and the logic low level;

select the second path bit signal in response to the first clock signal, the second clock signal, the third clock signal, and the fourth clock signal respectively having the logic low level, the logic high level, the logic high level, and the logic low level;

select the third path bit signal in response to the first clock signal, the second clock signal, the third clock signal, and the fourth clock signal respectively having the logic low level, the logic low level, the logic high level, and the logic high level; and select the fourth path bit signal in response to the first clock signal, the second clock signal, the third clock signal, and the fourth clock signal respectively having the logic high level, the logic low level, the logic low level, and the logic high level.

12. The transmitter of claim 10, wherein the first transmission bit signal indicates a most significant bit of a pulse amplitude modulation (PAM)-4 symbol, and wherein the second transmission bit signal indicates a least significant bit of the PAM-4 symbol.

13. The transmitter of claim 1, wherein the data path includes:

a serializer configured to generate a serialized data signal based on the data signal and the internal four-phase clock signal; and a shift register configured to receive the serialized data signal and the internal four-phase clock signal from the serializer, and to generate the path data signal based on the serialized data signal and the internal four-phase clock signal.

14. The transmitter of claim 1, wherein the phase interpolator is further configured to:

decrease a delay level of the internal four-phase clock signal in response to the control signal indicating the first phase state;

maintain the delay level of the internal four-phase clock signal in response to the control signal indicating the second phase state; and increase the delay level of the internal four-phase clock signal in response to the control signal indicating the third phase state.

15. The transmitter of claim 1, wherein the transmitter is configured to:

provide the transmission data signal to a receiver of an external communication device through a peripheral component interconnect express (PCIe) communication interface circuit.

16. A communication device comprising:

a data management circuit configured to manage a data signal;

a clock generator configured to generate a four-phase clock signal including a first clock signal, a second clock signal, a third clock signal, and a fourth clock signal;

a transmitter configured to provide a first transmission data signal to an external receiver; and a receiver configured to receive a second transmission data signal from an external transmitter, the transmitter including a phase interpolator configured to generate an internal four-phase clock signal based on the four-phase clock signal;

a data path configured to generate a path data signal based on the data signal and the internal four-phase clock signal;

at least one multiplexer configured to generate the first transmission data signal based on the path data signal and the four-phase clock signal; and a tri-state phase detector configured to provide the phase interpolator with a control signal indicating a first phase state, a second phase state, or a third phase state based on a target path bit signal of the path data signal, the first clock signal, and the fourth clock signal, and the phase interpolator further configured to interpolate the internal four-phase clock signal based on the control signal.

17. The communication device of claim 16, wherein the first clock signal, the second clock signal, the third clock signal, and the fourth clock signal have a first phase value, a second phase value delayed by 90 degrees from the first phase value, a third phase value delayed by 180 degrees from the first phase value, and a fourth phase value delayed by 270 degrees from the first phase value, respectively, and the at least one multiplexer is further configured to select the target path bit signal as a part of the first transmission data signal in response to the first and second clock signals each having a logic high level and the third and fourth clock signals each having a logic low level.

18. The communication device of claim 16, wherein the transmitter is further configured to provide the first transmission data signal to the external receiver through a peripheral component interconnect express (PCIe) communication interface circuit, and the receiver is further configured to receive the second transmission data signal from the external transmitter through the PCIe communication interface circuit.

19. A method of operating a transmitter, the method comprising:

generating an internal four-phase clock signal based on a four-phase clock signal including a first clock signal, a second clock signal, a third clock signal, and a fourth clock signal;

generating a path data signal based on a data signal and the internal four-phase clock signal;

generating a control signal indicating a late state, a hold state, or an early state based on a target path bit signal of the path data signal, the first clock signal, and the fourth clock signal; and interpolating the internal four-phase clock signal based on the control signal.

20. The method of claim 19, wherein the first clock signal, the second clock signal, the third clock signal, and the fourth clock signal have a first phase value, a second phase value delayed by 90 degrees from the first phase value, a third phase value delayed by 180 degrees from the first phase value, and a fourth phase value delayed by 270 degrees from the first phase value, respectively, and the generating of the control signal indicating the late state, the hold state, or the early state based on the target path bit signal of the path data signal, the first clock signal, and the fourth clock signal includes:

generating a first detection signal based on the target path bit signal and a rising edge of the fourth clock signal;

generating a second detection signal based on the target path bit signal and a rising edge of the first clock signal; and generating the control signal based on the first detection signal and the second detection signal.

* * * * *